(12) United States Patent
Leng

(10) Patent No.: US 12,501,769 B2
(45) Date of Patent: Dec. 16, 2025

(54) DISPLAY PANEL AND DISPLAY DEVICE

(71) Applicant: Hubei Yangtze Industrial Innovation Center Of Advanced Display Co., Ltd., Wuhan (CN)

(72) Inventor: Chuanli Leng, Wuhan (CN)

(73) Assignee: Hubei Yangtze Industrial Innovation Center Of Advanced Display Co., Ltd., Wuhan (CN)

( * ) Notice: Subject to any disclaimer, the term of this patent is extended or adjusted under 35 U.S.C. 154(b) by 653 days.

(21) Appl. No.: 17/859,395

(22) Filed: Jul. 7, 2022

(65) Prior Publication Data

US 2022/0344433 A1 Oct. 27, 2022

(30) Foreign Application Priority Data

Mar. 30, 2022 (CN) .......................... 202210334340.2

(51) Int. Cl.
*H10K 59/12* (2023.01)
*H10K 59/126* (2023.01)
*H10K 59/38* (2023.01)
*H10K 59/40* (2023.01)
*H10K 59/80* (2023.01)

(52) U.S. Cl.
CPC .......... *H10K 59/12* (2023.02); *H10K 59/126* (2023.02); *H10K 59/38* (2023.02); *H10K 59/40* (2023.02); *H10K 59/879* (2023.02); *H10K 59/8792* (2023.02); *H10K 59/873* (2023.02)

(58) Field of Classification Search
CPC ...... H10K 59/12; H10K 59/126; H10K 59/38; H10K 59/40; H10K 59/879; H10K 59/8792; H10K 59/873; H10K 50/84
See application file for complete search history.

(56) References Cited

U.S. PATENT DOCUMENTS

| | | | |
|---|---|---|---|
| 2020/0209916 A1* | 7/2020 | Zhang | G06F 1/1626 |
| 2020/0357362 A1* | 11/2020 | Shin | G09G 3/3233 |
| 2021/0376021 A1* | 12/2021 | Joo | H10K 59/8792 |
| 2021/0384377 A1* | 12/2021 | Imahori | G02F 1/133603 |
| 2022/0059805 A1* | 2/2022 | Cho | H10K 59/40 |

FOREIGN PATENT DOCUMENTS

| | | |
|---|---|---|
| CN | 111446276 A | 7/2020 |
| CN | 111477111 A | 7/2020 |
| CN | 111916480 A | 11/2020 |

\* cited by examiner

*Primary Examiner* — Norman D Richards
*Assistant Examiner* — Sammantha K Salaz
(74) *Attorney, Agent, or Firm* — KDW FIRM PLLC

(57) ABSTRACT

Provided are a display panel and a display device. The display panel includes a substrate, a display function layer and a light-shielding layer. The display function layer is located on the substrate, where the display function layer includes a plurality of light-emitting elements. The light-shielding layer is located on a side of the display function layer facing away from the substrate, where a plurality of openings are disposed on the light-shielding layer, and the plurality of openings expose the plurality of light-emitting elements. The plurality of light-emitting elements include a first light-emitting element, where an opening exposing the first light-emitting element is a first opening, a center of the first light-emitting element has an offset along a first direction relative to a center of the first opening, and the first direction is parallel to a plane where the substrate is located.

23 Claims, 14 Drawing Sheets

DISPLAY PANEL AND DISPLAY DEVICE

CROSS-REFERENCE TO RELATED APPLICATION

This application claims priority to Chinese Patent Application No. 202210334340.2 filed Mar. 30, 2022, the disclosure of which is incorporated herein by reference in its entirety.

TECHNICAL FIELD

Embodiments of the present disclosure relate to display technology and, in particular, to a display panel and a display device.

BACKGROUND

With the development of display technology, display technologies such as a liquid crystal display (LCD) and an organic light-emitting display (OLED) are widely used in the fields of televisions, mobile phones and public display. With the development of displays, images available for display of the displays become more and more abundant. Nowadays, the displays are developing towards a narrow bezel, a high contrast ratio, a high resolution, full color display, low power consumption, high reliability, a long service life and the like.

However, for a display with a relatively large display image or a bent region, at a front viewing angle, a viewing angle of an edge of a display region of a large-sized display or a viewing angle of a bent region of the display is different from that of a central region, brightness will vary with a variation of the viewing angle, and non-uniform display will exist, resulting in a reduced display effect. Therefore, the non-uniform display of the edge or the bent region of the large-image display becomes an urgent problem to be solved by those skilled in the art.

SUMMARY

Embodiments of the present disclosure provide a display panel and a display device to improve the uniformity of a display image of the display panel and a display effect.

In a first aspect, the embodiments of the present disclosure provide a display panel. The display panel includes a substrate, a display function layer and a light-shielding layer.

The display function layer is located on the substrate, where the display function layer includes a plurality of light-emitting elements.

The light-shielding layer is located on a side of the display function layer facing away from the substrate, where a plurality of openings are disposed on the light-shielding layer, and the plurality of openings expose the plurality of light-emitting elements.

The plurality of light-emitting elements include a first light-emitting element, where an opening exposing the first light-emitting element is a first opening, a center of the first light-emitting element has an offset along a first direction relative to a center of the first opening, and the first direction is parallel to a plane where the substrate is located.

In a second aspect, the embodiments of the present disclosure further provide a display device. The display device includes the above display panel.

DETAILED DESCRIPTION

Figure 1:
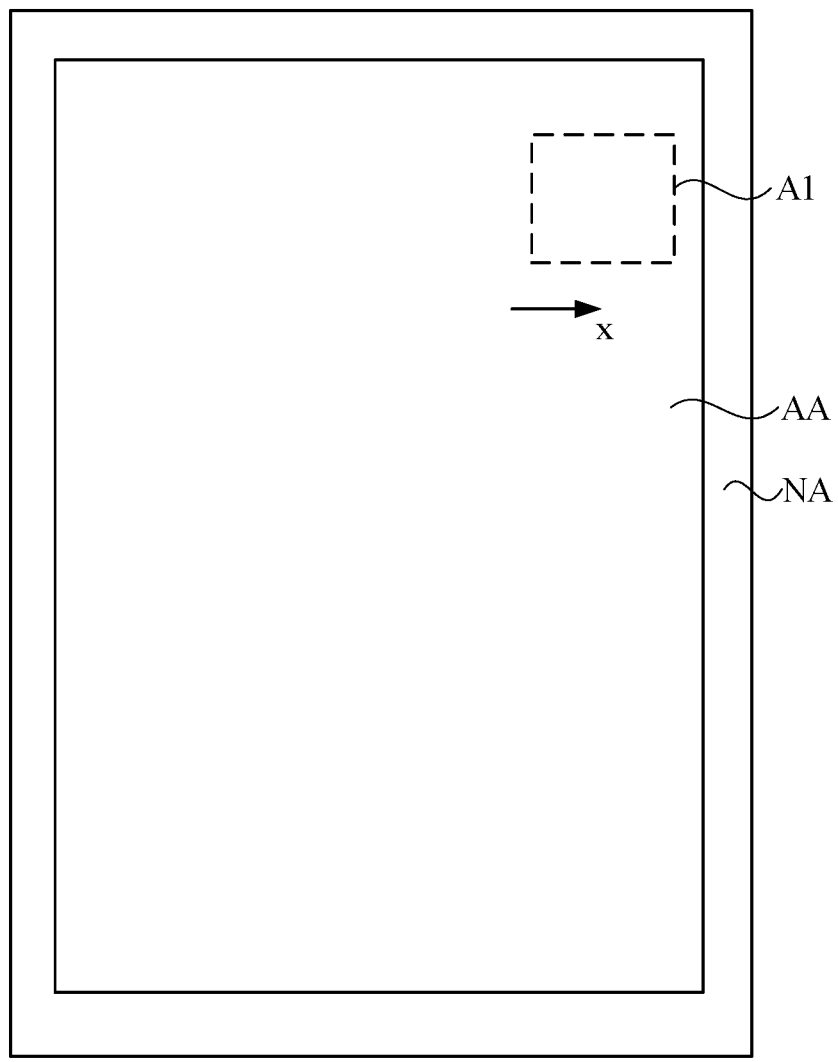
FIG. 1 is a top view of a display panel according to an embodiment of the present disclosure.

The present disclosure is further described hereinafter in detail in conjunction with drawings and embodiments. It is to be understood that the embodiments described herein are intended to explain the present disclosure and not to limit the present disclosure. Additionally, it is to be noted that for ease of description, only part, not all, of structures related to the present disclosure are illustrated in the drawings.

Terms used in the embodiments of the present disclosure are only used to describe particular embodiments and not intended to limit the present disclosure. It is to be noted that nouns of locality, such as "on", "below", "left" and "right", used in the embodiments of the present disclosure, are described from the angles illustrated in the drawings and are not to be construed as limitations to the embodiments of the present disclosure. Additionally, in the context, it is to be understood that when an element is formed "on" or "below" another element, the element may be directly formed "on" or "below" the other element or may be indirectly formed "on" or "below" the other element via an intermediate element. The terms "first", "second" and the like are only used for description and used to distinguish between different components rather than indicate any order, quantity or importance. For those of ordinary skill in the art, the specific meanings of the preceding terms in the present disclosure can be construed according to specific situations.

With the continuous development of display technology, color filter on TFE (CFOT) technology, as an emerging hot technology, can significantly reduce the power consumption of an OLED and is compatible with a flexible bendable screen. The CFOT technology is to make a color filter after thin film encapsulation (TFE), and a polarizer is replaced with the color filter for filtering light. However, a light-shielding layer will be disposed around the color filter, resulting in viewing angle shielding in some regions (such as a bent region) of the screen.

In view of the above, the embodiments of the present disclosure provide a display panel. The display panel includes a substrate, a display function layer and a light-shielding layer. The display function layer is located on the substrate, where the display function layer includes a plurality of light-emitting elements. The light-shielding layer is located on a side of the display function layer facing away from the substrate, where a plurality of openings are disposed on the light-shielding layer, and the plurality of openings expose the plurality of light-emitting elements. The plurality of light-emitting elements include a first light-emitting element, where an opening exposing the first light-emitting element is a first opening, a center of the first light-emitting element has an offset along a first direction relative to a center of the first opening, and the first direction is parallel to a plane where the substrate is located.

FIG. 1 is a top view of a display panel according to an embodiment of the present disclosure. Referring to FIG. 1, the display panel includes a display region AA and a non-display region NA. In the display region AA, the display panel may include a plurality of pixels for displaying an image, and in the non-display region NA, the display panel may include a peripheral driver circuit.

In another embodiment, the display panel includes the display region AA, and the non-display region NA may be located on some sides of the display region AA (for example, the non-display region is located on a lower side of the display region).

In another embodiment, the display panel includes the display region AA, and no non-display regions may be disposed on a periphery of the display region AA, that is, a bezel of the display panel is zero.

Figure 2:
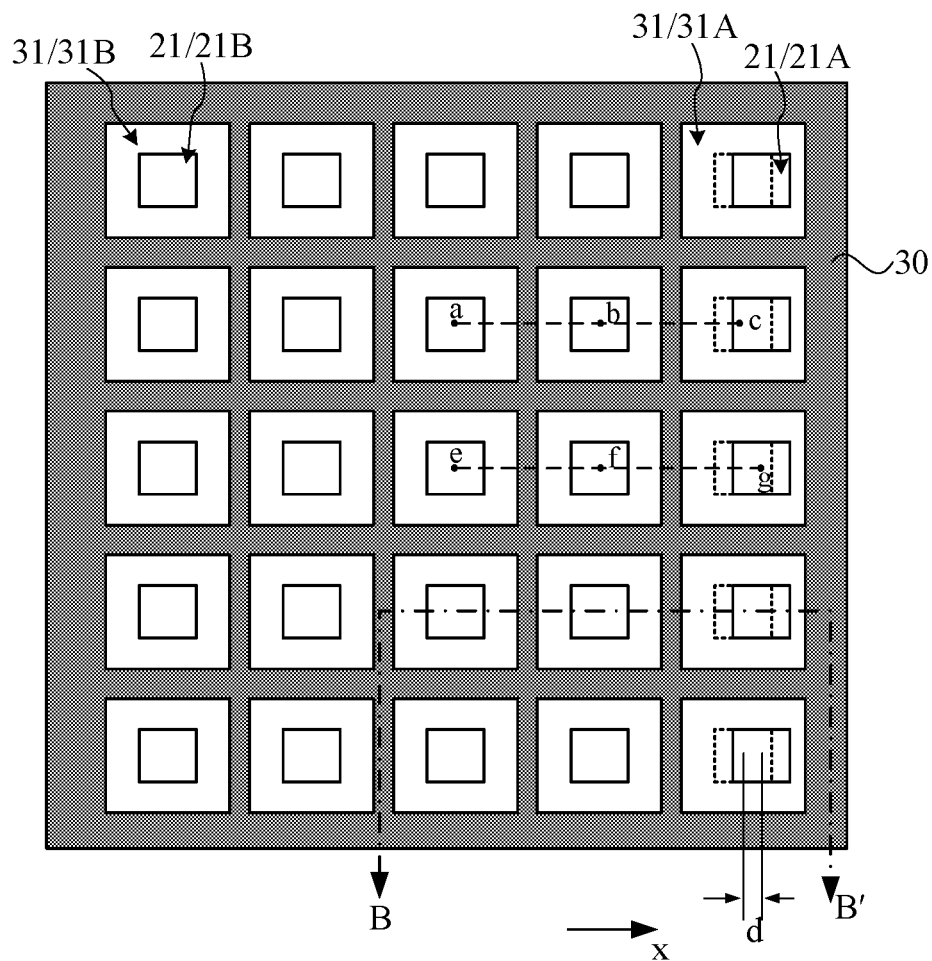
FIG. 2 is an enlarged view of a region A1 in FIG. 1.
Figure 3:
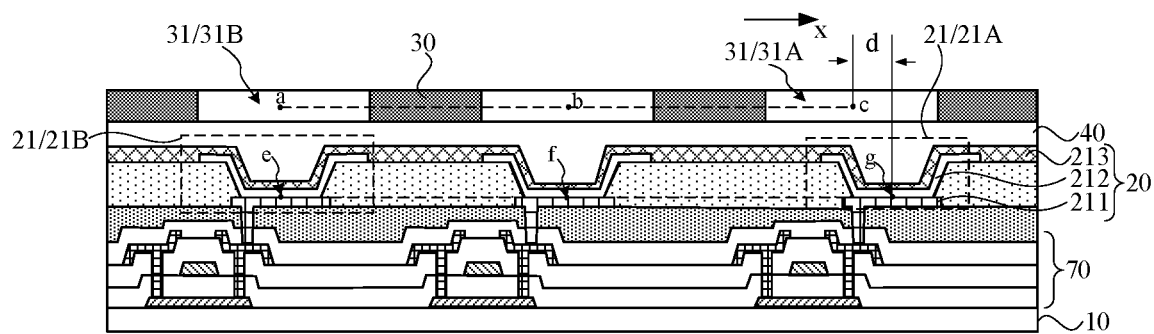
FIG. 3 is a sectional view taken along a section line BB' in FIG. 2.

FIG. 2 is an enlarged view of a region A1 in FIG. 1. FIG. 3 is a sectional view taken along a section line BB' in FIG. 2.

Referring to FIG. 3, the display panel includes a substrate 10. The substrate 10 may be a hard substrate, such as a glass substrate or a quartz substrate, or a flexible substrate, such as a polyimide (PI) substrate.

A display function layer 20 is located on the substrate 10, and the display function layer 20 includes a plurality of light-emitting elements 21. The plurality of light-emitting elements 21 may be an organic light-emitting diode (OLED). The OLED generally includes a first electrode layer 211, a light-emitting layer 212 and a second electrode layer 213 which are stacked, and a hole injection layer (HIL), a hole transport layer (HTL), an electron injection layer (EIL), an electron transport layer (ETL) and the like may also be disposed as needed. In other embodiments, the plurality of light-emitting elements 21 may also be an inorganic light-emitting diode. Light emitted by the plurality of light-emitting elements 21 is used for achieving an image display function of the display panel.

An array layer 70 may be further included between the plurality of light-emitting elements 21 and the substrate 10. The array layer 70 includes pixel circuits arranged in an array, and each of the pixel circuits may consist of a thin-film transistor, where the thin-film transistor may be formed in a manner of stacking films such as a semiconductor film, an insulating layer and a metal layer. For example, FIG. 3 shows a thin-film transistor connected to a light-emitting diode 21. The thin-film transistor may use amorphous silicon, polycrystalline silicon, low-temperature polycrystalline silicon (LTPS), an oxide semiconductor, an organic semiconductor or the like as a channel layer. The thin-film transistor may have different types of channel layer. For example, in view that an effect or a manufacturing process of the thin-film transistor, both a thin-film transistor including the oxide semiconductor and a thin-film transistor including LTPS may be included in one pixel circuit.

A thin film encapsulation layer 40 is located on a side of the display function layer 20 facing away from the substrate 10 and covers the plurality of light-emitting elements 21 in the display function layer 20. The thin film encapsulation layer 40 is used for preventing water and oxygen from intruding into the plurality of light-emitting elements 21, thereby preventing the plurality of light-emitting elements 21 from a function failure. Specifically, the TFE layer 40 may include a laminated structure consisting of an inorganic layer and an organic layer.

A light-shielding layer 30 is located on the side of the display function layer 20 facing away from the substrate 10. In the present embodiment, the light-shielding layer 30 may be disposed on the thin film encapsulation layer 40 and may include at least one of a touch electrode or a black matrix.

Referring to FIG. 2, a plurality of openings 31 are disposed on the light-shielding layer 30. Each opening 31 correspondingly exposes one light-emitting element 21, and the light-emitting elements 21 include a first light-emitting element 21A, where an opening 31 exposing the first light-emitting element 21A is a first opening 31A, a center of the first light-emitting element 21A has an offset d along a first direction x relative to a center of the first opening 31A, and the first direction x is parallel to a plane where the substrate is located. The light-emitting elements 21 further include a second light-emitting element 21B, and the openings 31 further include a second opening 31B, where the second opening 31B exposes the second light-emitting element 21B, a center of the second light-emitting element 21B coincides with a center of the second opening 31B, a dashed-line box in the first opening 31A indicates a position where no offsets relative to the center of the first opening 31A occur in the center of the first light-emitting element 21A, and a solid line indicates a position after the offset occurs in the first light-emitting element 21A. FIG. 2 shows that a center of a first light-emitting element 21A in a lower right corner has an offset d relative to a center of a first opening 31A in the lower right corner, where a left straight line passes through the center of the first opening 31A, a right straight line passes through the center of the first light-emitting element 21A, and a distance between the two centers is d.

It is to be noted that the center of the first light-emitting element 21A and the center of the first opening 31A may be understood as midpoints in one-dimension, for example, a midpoint of the first light-emitting element 21A in the first direction x and a midpoint of the first opening 31A in the first direction x. Alternatively, the center of the first light-emitting element 21A and the center of the first opening 31A may be understood as geometric centers in two-dimension, for example, when any one of the first light-emitting element 21A and the first opening 31A is circular in shape, the center thereof is a center of the circle.

In the display panel including the light-shielding layer, light-emitting elements located at different positions of the display panel are affected by the light-shielding layer, resulting in brightness inconsistency at a particular viewing angle. For example, for a display screen whose side surface is a curved display portion and whose front surface is a planar display portion, when a user faces the planar display portion of the display screen in a front view, light emission brightness of a light-emitting element located in the curved display portion of the display screen is relatively low for the user. A decisive factor affecting the light emission brightness is that a distance between one side of an opening on the light-shielding layer exposing the light-emitting element (specifically, a side of the opening close to the planar display portion, hereinafter referred to as a shielding side) and the light-emitting element. Light emission brightness of the light-emitting element at a large viewing angle can be improved in a manner of increasing the distance between the shielding side and the light-emitting element. The inventor of the present application has found that this manner is easy to bring about reflectance inconsistency and hue inconsistency of the display panel.

In a display panel using the CFOT technology, the color filter can filter the light in place of the polarizer and perform a certain degree of anti-reflection by absorbing light with a particular band in ambient light so that reduce the reflectance of the display panel can be reduced. That is, in the display panel using the CFOT technology, a structure that performs the anti-reflection includes not only the light-shielding layer but also the color filter. Since a degree to which the outside ambient light is absorbed by the light-shielding layer is greater than a degree to which the outside ambient light is absorbed by the color filter, if the light-shielding layer and the color filter have different area proportions at different positions of the display panel, the different positions of the display panel have different reflectance, affecting a display effect of the display panel. In addition, among the color filter, a color filter that filters light with different bands absorbs light with different bands when the color filter performs the anti-reflection. In this manner, different area proportions of color filters with different light-filtering functions among the color filter will bring about the hue inconsistency.

Positions of the light-shielding layer and the color filter are generally in a complementary relationship. An adjustment of the light-shielding layer will directly affect the position of the color filter. In the case where the light-shielding layer and the color filter simultaneously have different degrees of contributions to the anti-reflection of the display panel, when the light-shielding layer is adjusted, a factor affecting the reflectance becomes complicated, increasing a difficulty of solving the technical problem of the reflectance inconsistency. In addition, a varied position of the color filter also affects hue consistency. A mutual-effect manner of "a slight move in one part may affect the situation as a whole" brings about a great difficulty in solving the problem of the brightness inconsistency at the large viewing angle.

In the present application, the center of the first light-emitting element 21A has a certain offset relative to the center of the first opening 31A. In the embodiment of FIG. 2, an offset towards an edge of the display region relative to the first opening 31A occurs in the center of the first light-emitting element 21A so that part of the light emitted by the first light-emitting element 21A has a tendency to be offset towards a central region and display non-uniformity caused by different viewing angles of the center region and an edge region can be offset to some extent. Moreover, this solution reduces an effect on the area proportions of both the light-shielding layer and the color filter and an effect on the area proportion of the color filters with different functions, that is, the technical solution of the present application will not additionally bring about the reflectance inconsistency and the hue inconsistency when solving the problem of the display non-uniformity caused by different viewing angles.

Positions of openings shown in FIG. 2 are constant (the openings are arranged in a uniform array, that is. distances between centers of two adjacent openings are equal in the first direction x, for example, in FIGS. 2 and 3, line segments ab and bc are equal in length, where a, b and c denote centers of corresponding openings, respectively), and light-emitting elements have an offset relative to the openings, for example, in FIGS. 2 and 3, a line segment of is shorter than a line segment fg, where e, f and g denote centers of corresponding light-emitting elements, respectively. In other embodiments, positions of the light-emitting elements may be constant (the light-emitting elements are arranged in a uniform array, that is, distances between centers of two adjacent light-emitting elements are equal in the first direction), and an offset occurs at the positions of the openings, which may be designed according to an actual situation in a specific implementation.

The "offset" mentioned in the present application does not mean that in a process of using the display panel, a relative move will occur at the positions of the light-emitting elements or the positions of the openings, but means that in a process of designing the display panel, the positions of the light-emitting elements vary relative to a position of a light-emitting element whose center coincides with a center of an opening, or the positions of the openings vary relative to a position of an opening whose center coincides with a center of a light-emitting element.

It is to be noted that the shape and the number of the plurality of light-emitting elements and the shape and the number of the plurality of openings shown in the drawings in the embodiments of the present disclosure are only used for illustratively explaining the technical solutions of the present disclosure and not to limit the embodiments of the present disclosure.

Figure 4:
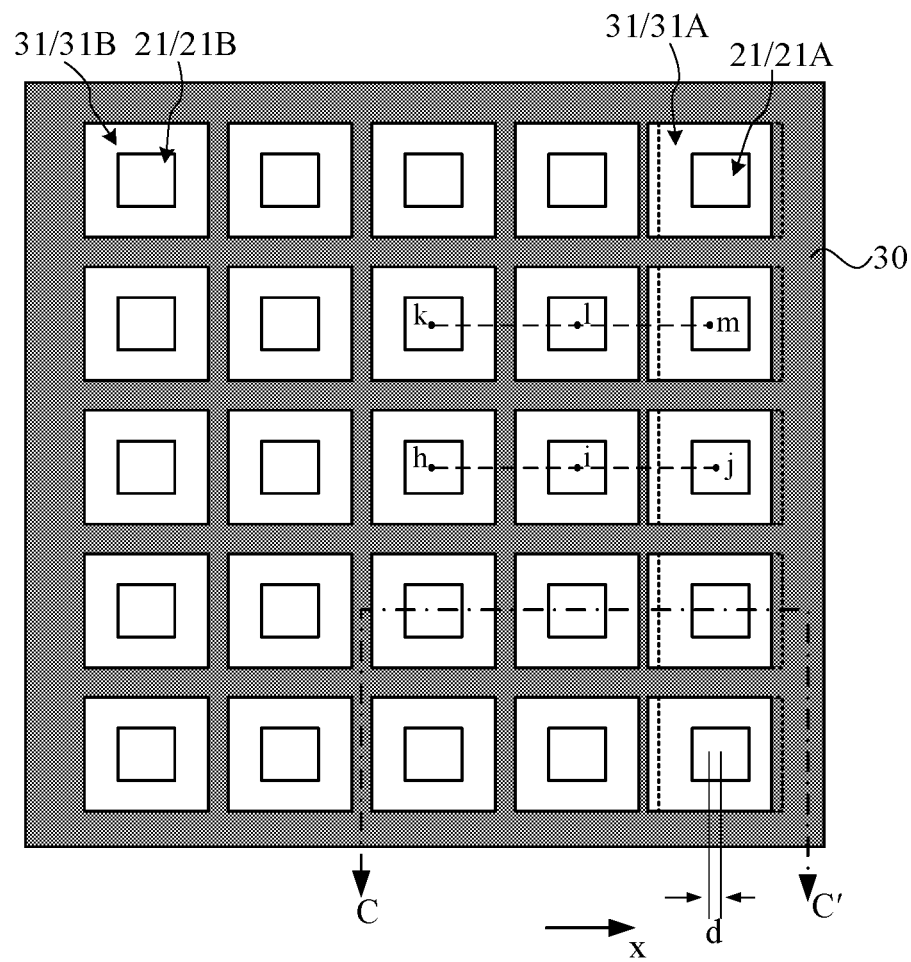
FIG. 4 is another enlarged view of the region A1 in FIG. 1.
Figure 5:
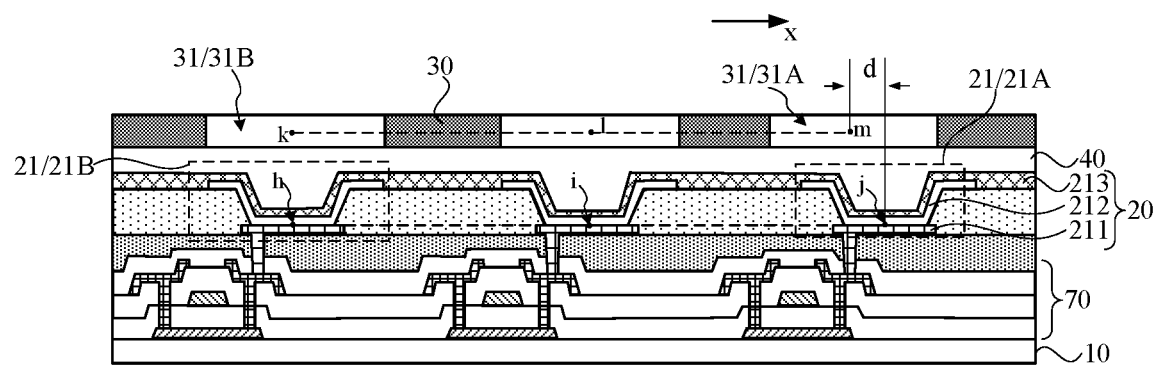
FIG. 5 is a sectional view taken along a section line CC' in FIG. 4.

FIG. 4 is another enlarged view of the region A1 in FIG. 1. FIG. 5 is a sectional view taken along a section line CC' in FIG. 4. Referring to FIG. 4, the plurality of light-emitting elements 21 are arranged in an array (if colors of the plurality of light-emitting elements 21 are distinguished, it may be understood that light-emitting elements 21 of the same color are arranged in an array, and array arrangement rules of light-emitting elements 21 of different colors may be different). For positions of the plurality of openings 31, a dashed line in FIG. 4 indicates a position where no offsets occur in the first opening 31A, that is, a position where each opening is arranged in an array, or it may be understood as a position where the center of the first opening 31A coincides with the center of the first light-emitting element 21A, and a corresponding solid line indicates after an offset occurs in the first opening 31A. Other structures, reference numerals and corresponding representations are the same as or similar to the preceding embodiments and are not described in detail here. In FIGS. 4 and 5, line segments hi and ij are equal in length, where h, i and j denote centers of corresponding light-emitting elements, respectively, and a line segment kl is longer than a line segment lm, where k, l and m denote centers of corresponding openings, respectively.

In the embodiment of FIG. 4, an offset towards an interior of the display region relative to the first light-emitting element 21A occurs in the center of the first opening 31A so that part of the light emitted by the first light-emitting element 21A also has the tendency to be offset towards the central region and the display non-uniformity caused by different viewing angles of the center region and the edge region can be offset to some extent. Moreover, for the technical solution of the offset which occurs in the light-emitting elements, corresponding pixel circuits, positions of connection wires, an arrangement manner and the like may need to be redesigned in addition to designing the offset which occurs in the light-emitting elements. This solution reduces an effect of preparing non-uniformly distributed light-emitting elements on a manufacturing process, that is, the technical solution of the present application will not additionally increase a difficulty in preparing the display function layer and the array layer when solving the problem of the display non-uniformity caused by different viewing angles.

To conclude, in the technical solution of the embodiments of the present disclosure, the plurality of light-emitting elements emit light for image display. The light-shielding layer is used for, on one hand, reducing reflectance of a non-light-emitting region and, on the other hand, defining exit angles of the light emitted by the plurality of light-emitting elements. The center of the first light-emitting element has the offset along the first direction relative to the center of the first opening so that viewing angle shielding due to different viewing angles can be avoided in some display regions (for example, an edge position of a large-area display region or a bent display region), improving display uniformity.

On the basis of the preceding embodiments, optionally, the display panel further includes a first display region and a second display region, where the first light-emitting element is located in the second display region, and the first direction is a direction pointing to the second display region from the first display region.

Figure 6:
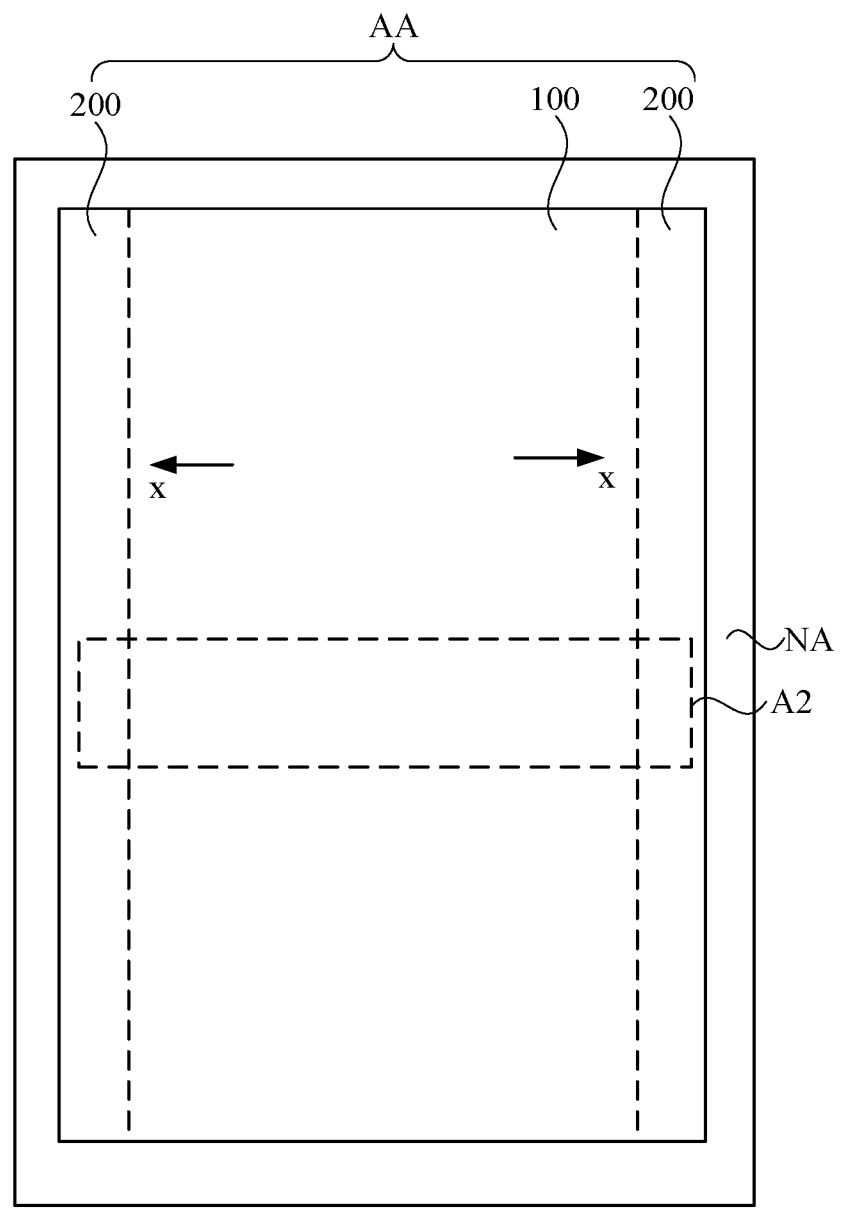
FIG. 6 is a top view of another display panel according to an embodiment of the present disclosure.
Figure 7:
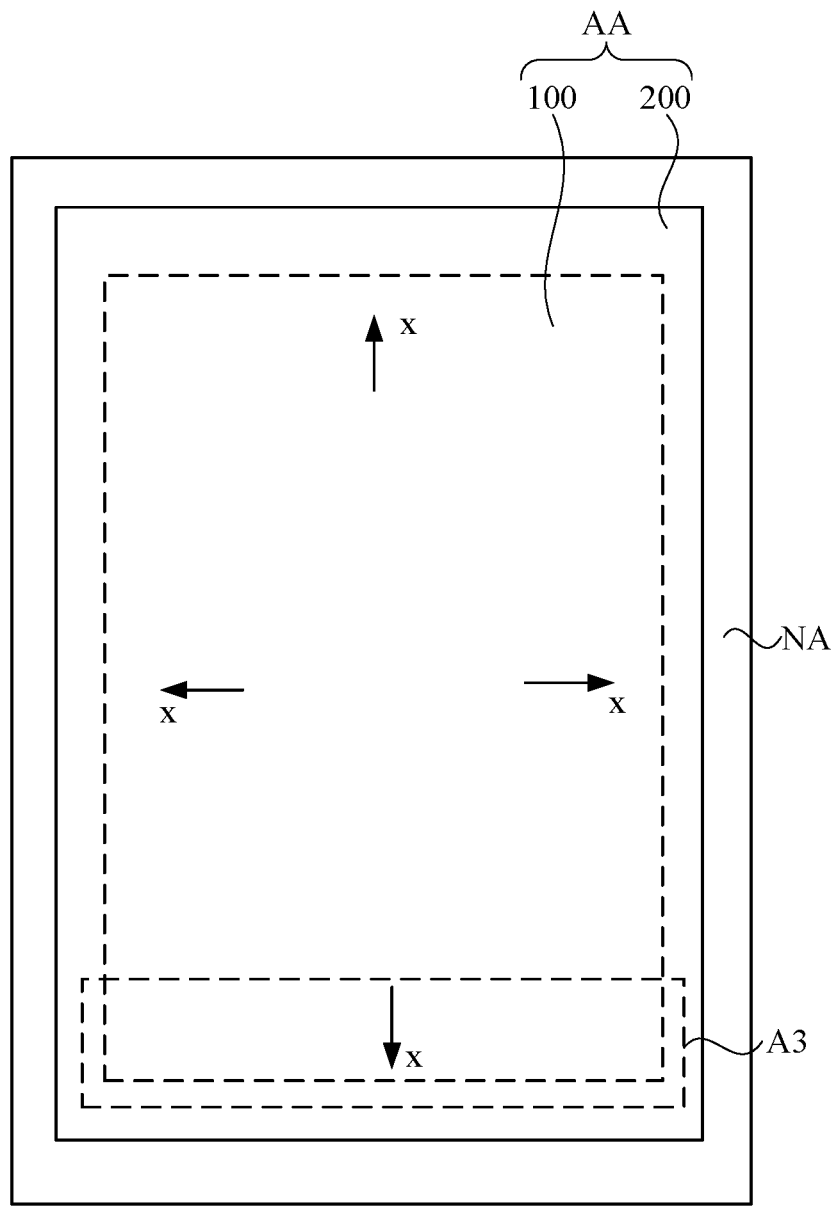
FIG. 7 is a top view of another display panel according to an embodiment of the present disclosure.
Figure 8:
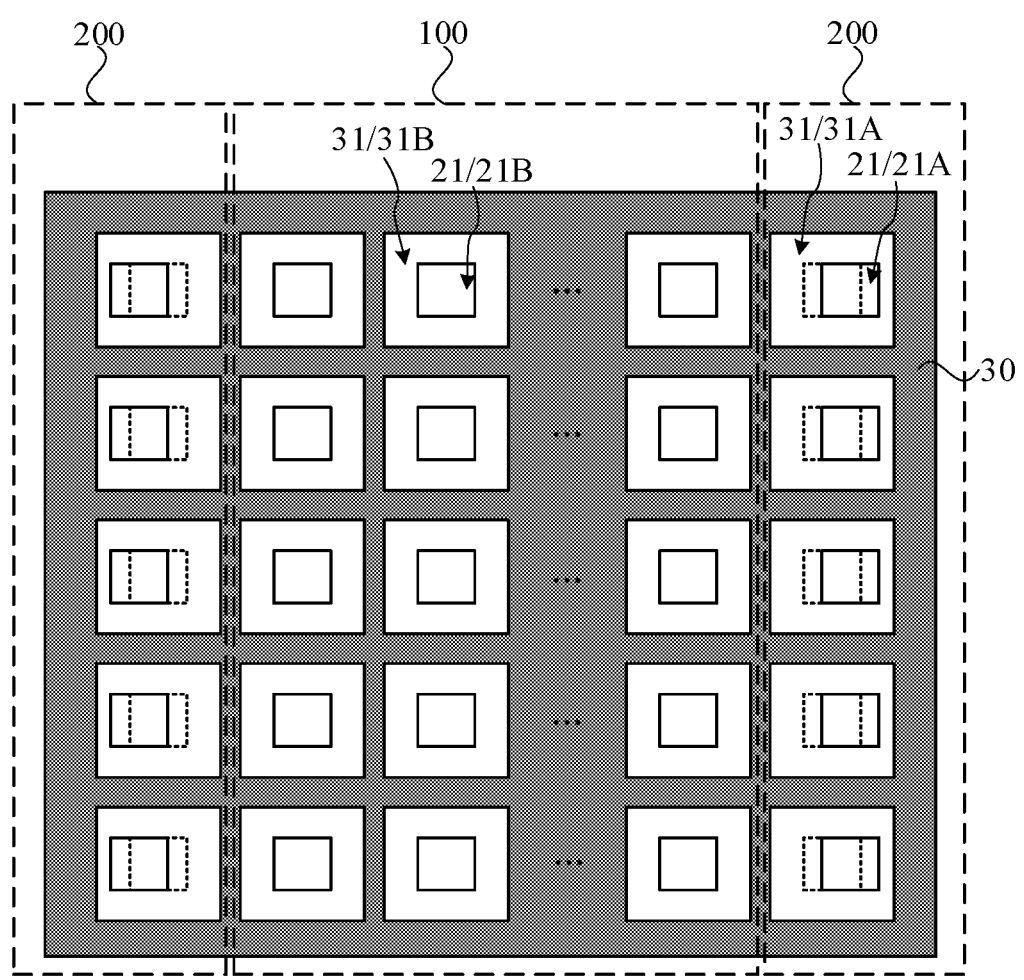
FIG. 8 is an enlarged view of a region A2 in FIG. 6.
Figure 9:
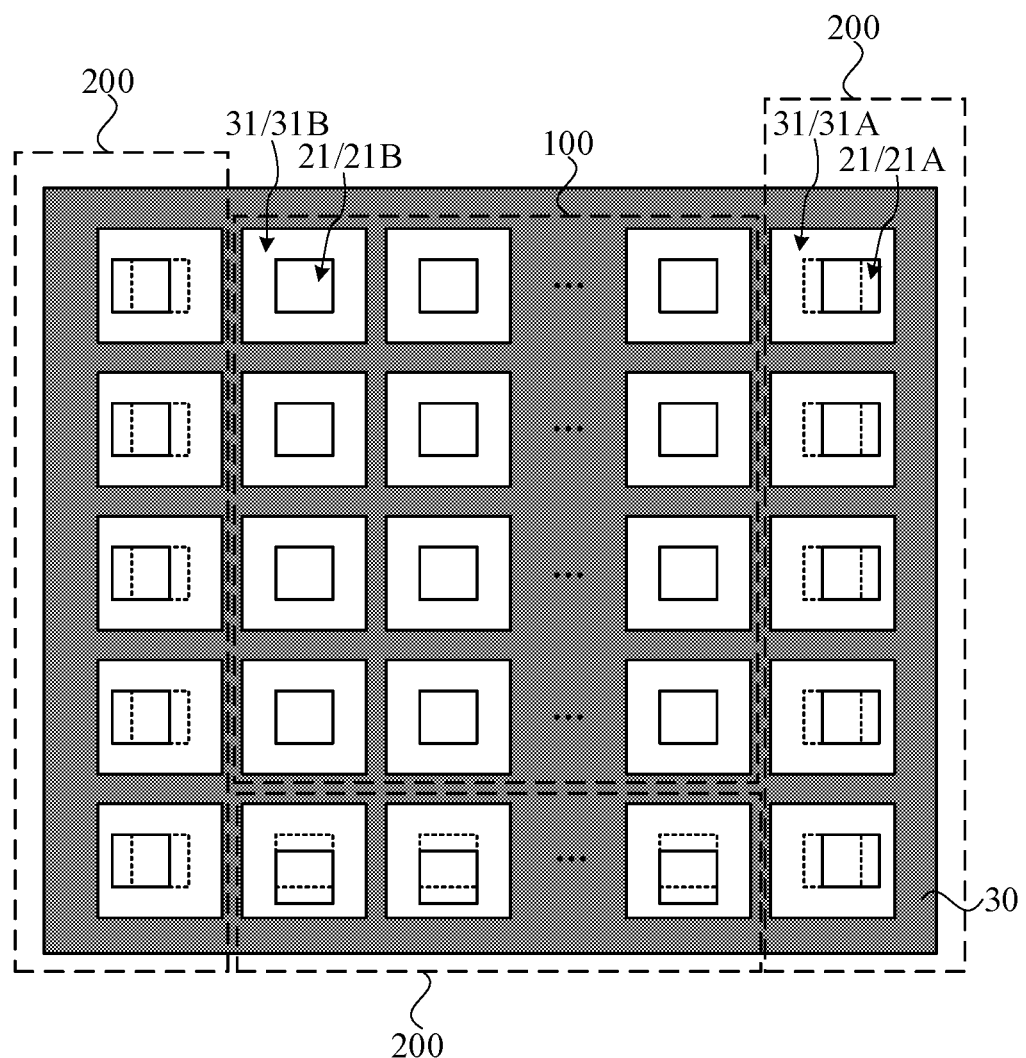
FIG. 9 is an enlarged view of a region A3 in FIG. 7.

FIG. 6 is a top view of another display panel according to an embodiment of the present disclosure. FIG. 7 is a top view of another display panel according to an embodiment of the present disclosure. FIG. 8 is an enlarged view of a region A2 in FIG. 6. FIG. 9 is an enlarged view of a region A3 in FIG. 7. Referring to FIGS. 6 to 9, a display region AA of the display panel includes a first display region 100 and a second display region 200. FIGS. 6 and 8 illustratively show that the display panel includes one first display region 100 and two second display regions 200 located on a left side and a right side of the one first display region 100, respectively, and a first direction is a direction pointing to the two sides from a center. FIGS. 7 and 9 illustratively show that the display panel includes one display region 100 and a second display region 200 disposed on a left side, a right side, an upper side and a lower side around the first display region 100 (the second display region located on the upper side is not shown in FIG. 9), and a first direction in FIG. 7 is a direction pointing to a periphery from a center. In other embodiments, the number of second display regions may also be one, which may be disposed according to an actual requirement in a specific implementation. For example, the second display region is disposed only on one side, or optionally, the first display region and the second display region are connected and jointly constitute a second curved display region. That is, a display region of the display panel may be circular in shape, and a display region encircles the center is the second curved display region, for example, an annular or approximately annular display panel for a bracelet, a watch and the like. In a specific implementation, a first light-emitting element 21A may be located in a region near an edge of the display panel. For example, when a user faces a central region of the display panel in a front view, the edge region and the central region have different viewing angles. A center of the first light-emitting element 21A and a first opening 31A may have an offset along a horizontal direction (parallel to a row direction) as shown in FIG. 8, or along the horizontal direction and a vertical direction (parallel to a column direction) as shown in FIG. 9, or only along the vertical direction, or along an oblique direction (for example, a diagonal direction of the light-emitting element).

With continued reference to FIG. 8 or FIG. 9, optionally, a plurality of light-emitting elements 21 further include a second light-emitting element 21B, where an opening exposing the second light-emitting element 21B is a second opening 31B, a center of the second light-emitting element 21B coincides with a center of the second opening 31B, and the second light-emitting element 21B is located in the first display region 100.

It is to be understood that the coincidence described here may be understood as that the center of the second light-emitting element 21B coincides with the center of the second opening 31B along a direction parallel to a plane where a substrate is located. In a specific implementation, the coincidence here contains a coincidence in the case of a process error. For example, in a process of aligning the opening and the light-emitting element during a manufacture of the display panel, the process error is generally less than 1 μm. If the center point of the light-emitting element has an offset less than 1 μm relative to the center point of the opening, it may be understood as the coincidence.

With the development of flexible display technology, for a flexible display that is bendable, a bent region may also display an image, such that the flexible display has a relatively high screen-to-body ratio and a relatively narrow bezel, significantly improving user experience. The technical solution of the present embodiment may be applicable to a flexible display panel including a curved display region. Optionally, the first display region is a planar display region, and the second display region is a first curved display region.

Figure 10:
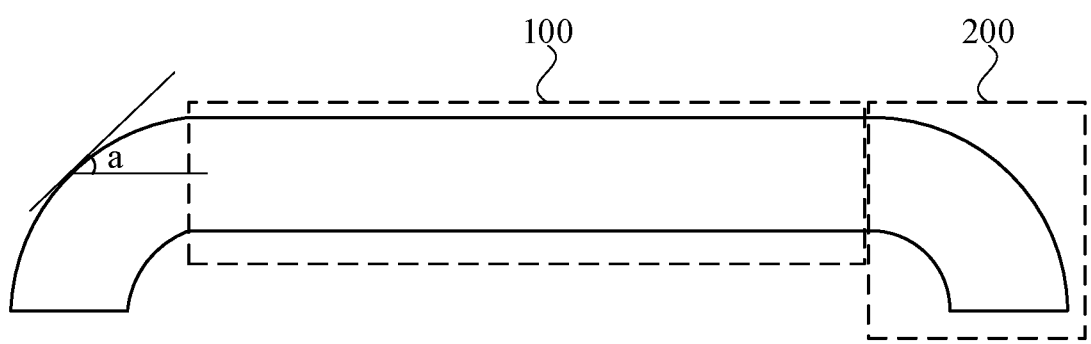
FIG. 10 is a structure diagram of a display panel according to an embodiment of the present disclosure.

For example, a display panel including two flexible display regions is used as an example. FIG. 10 is a side view of a display panel according to an embodiment of the present disclosure. Specifically, FIG. 10 may be a front view of a side surface below the display panel shown in FIG. 6. Referring to FIG. 10, the display panel includes one first display region 100 and two second display regions 200, where each of the two second display regions 200 is a first curved display region. Since a display surface of each of the two second display regions 200 includes a curved surface, the each of the two second display regions 200 is generally an auxiliary display region, and the one first display region 100 is a main display region. When a user faces the first display region 100 in a front view during use, the two second display regions 200 and the first display region 100 will have different display effects due to the problem of viewing angles. A light-emitting element in the second display region has a preset offset with a corresponding opening so that image uniformity of the curved display region and the planar display region can be improved.

It is to be noted that the display panel shown in FIG. 10 being a double-curved display panel is only illustrative. In other embodiments, the display panel may be a single-curved display panel or a four-curved display panel, and the first curved display region and the planar display region may be connected to form an integral display region, or may be independent display regions, which may be designed according to an actual requirement in a specific implementation.

Optionally, the first curved display region has a plurality of bending angles, where each of the plurality of bending angles is an acute angle between a tangent of the first curved display region and a plane where the planar display region is located. At the same bending angle, each first light-emitting element corresponds to the same offset.

Figure 11:
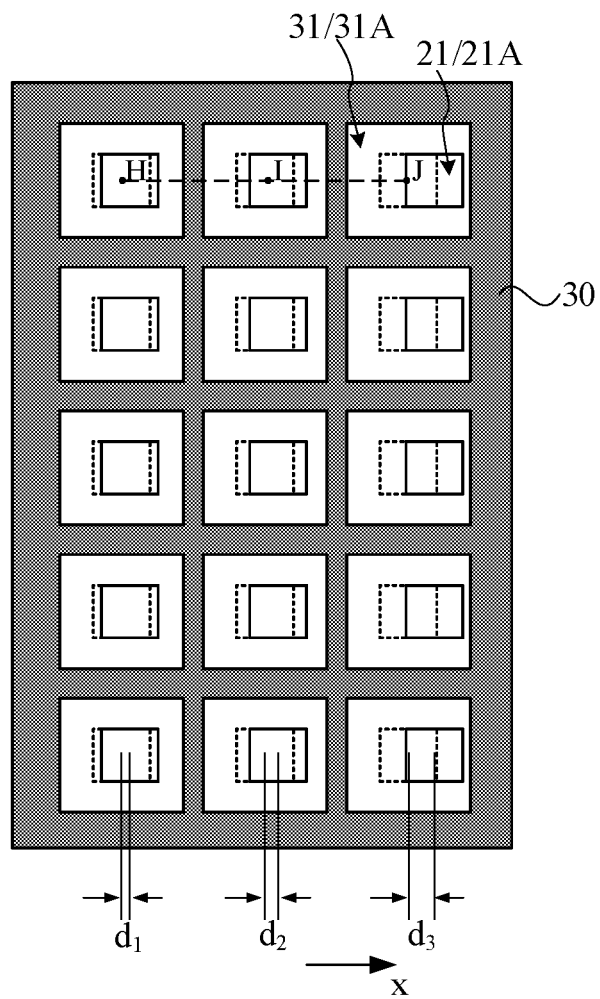
FIG. 11 is a partial top view of a display panel according to an embodiment of the present disclosure.

For example, with continued reference to FIG. 10, a bending angle a of the first curved display region is an acute angle between a tangent of the first curved display region and a plane where the planar display region is located. Specifically, along a direction from the planar display region to an edge of the display region, the bending angle a gradually increases. Specifically, a size and a range of the bending angle may be set according to an actual situation. FIG. 11 is a partial top view of a display panel according to an embodiment of the present disclosure. Referring to FIG. 11, first light-emitting elements 21A in the same column have the same bending angle in the first curved display region, and at the same bending angle, each first light-emitting element 21A corresponds to the same offset.

Since observation viewing angles corresponding to the same bending angle are the same, the offsets of the same bending angle are set to be the same so that the display uniformity can be effectively improved. Optionally, the first curved display region has a plurality of bending angles, where each of the plurality of bending angles is an acute angle between a tangent of the first curved display region and a plane where the planar display region is located. As the bending angle increases, an offset corresponding to the first light-emitting element progressively increases.

With continued reference to FIG. 11, FIG. 11 illustratively shows three columns of first light-emitting elements 21A. Along a first direction x (a direction pointing to a second display region from a first display region), the bending angle gradually increases, and offsets d1, d2 and d3 corresponding to the three columns of first light-emitting elements 21A sequentially increase, that is, the first light-emitting element 21A has an offset proportional to the bending angle, where a dashed-line box in a first opening 31A indicates a position where no offsets relative to a center of the first opening 31A occur in a center of the first light-emitting element 21A, and a solid line indicates a position after the offset occurs in the first light-emitting element 21A. FIG. 11 shows offsets of centers of first light-emitting elements 21A in a lowermost row relative to centers of first openings 31A in the lowermost row, where in a diagram of each corresponding offset, a left straight line passes through the center of the first opening 31A, and a right straight line passes through the center of the first light-emitting element 21A. The following embodiments where an offset occurring in a light-emitting element is used as an example have the same representation as FIG. 11. For example, for the double-curved display panel, two first curved display regions are located on a left side and a right side of the planar display region, respectively, a center of a light-emitting element in the left curved display region is shifted to the left relative to a corresponding opening, a center of a light-emitting element in the right curved display region is shifted to the right relative to a corresponding opening, and the offset increases as the bending angle increases, thereby improving the display uniformity of the curved display region and the planar display region.

Optionally, the first curved display region has a plurality of bending angles, where each of the plurality of bending angles is an acute angle between a tangent of the first curved display region and a plane where the planar display region is located. The first light-emitting element includes a first type of light-emitting element and a second type of light-emitting element, where a first opening exposing the first type of light-emitting element is a first type of opening, a first opening exposing the second type of light-emitting element is a second type of opening, an area of the first type of light-emitting element is greater than an area of the second type of light-emitting element, and an area of the first type of opening is greater than an area of the second type of opening. At the same bending angle, an offset corresponding to the first type of light-emitting element is less than an offset corresponding to the second type of light-emitting element.

An image displayed on the display panel is generally a color image, and light-emitting elements of a plurality of different emitted colors need to be disposed, such as a red light-emitting element, a green light-emitting element and a blue light-emitting element. For an OLED display panel, areas of light-emitting elements of different colors are generally designed to be different due to different lifetimes of light-emitting layers of the light-emitting elements. For example, an area of the blue light-emitting element is the largest, an area of the green light-emitting element is the smallest, and an area of the red light-emitting element is less than or equal to the area of the blue light-emitting element. For example, in a certain embodiment, the first type of light-emitting element may be the blue light-emitting element or the red light-emitting element, and the second type of light-emitting element may be the blue light-emitting element. The first type of light-emitting element corresponds to the first type of opening, and the second type of light-emitting element corresponds to the second type of opening. At the same bending angle, the offset corresponding to the first type of light-emitting element is less than the offset corresponding to the second type of light-emitting element. In other embodiments, light-emitting elements of different emitted colors may correspond to the same offset, and the same offset rule or different offset rules may be set for the light-emitting elements of different colors, which is not limited in the embodiments of the present disclosure.

Figure 12:
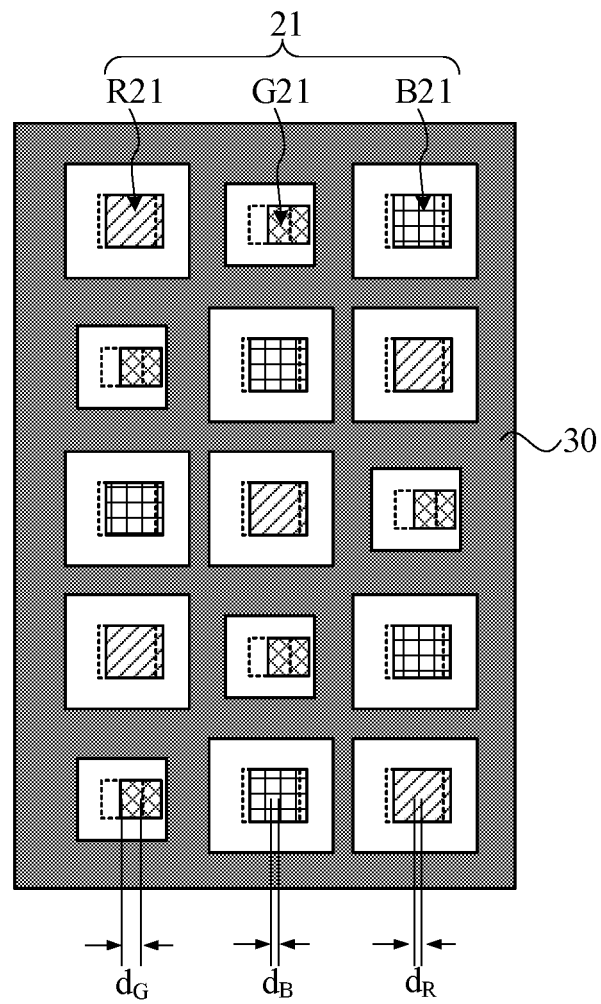
FIG. 12 is a partial top view of another display panel according to an embodiment of the present disclosure.

For example, FIG. 12 is a partial top view of another display panel according to an embodiment of the present disclosure. Referring to FIG. 12, a plurality of light-emitting elements 21 include a red light-emitting element R21, a green light-emitting element G21 and a blue light-emitting element B21, where an area of the red light-emitting element R21 is the same as an area of the blue light-emitting element B21, each of the red light-emitting element R21 and the blue light-emitting element B21 is a first type of light-emitting element, and the green light-emitting element G21 is a second type of light-emitting element. At the same bending angle (light-emitting elements corresponding to openings in the same column in FIG. 12), and each of an offset corresponding to the red light-emitting element R21 and an offset corresponding to the blue light-emitting element B21 is less than an offset corresponding to the green light-emitting element G21. For example, $d_R=d_B<d_G$ is shown in FIG. 12. When an area of an opening is relatively small, a viewing angle of light emission of a light-emitting element is relatively small. A corresponding offset is increased so that an effect brought about by the relatively small area of the opening can be balanced. In other embodiments, the area of the red light-emitting element and area of the blue light-emitting element may be different. For example, the area of the blue light-emitting element is greater than the area of the red light-emitting element, and the offset corresponding to the red light-emitting element is greater than the offset of the blue light-emitting element.

Optionally, the display panel further includes a dielectric layer located between the display function layer and the light-shielding layer, where the first curved display region has a plurality of bending angles, where each of the plurality of bending angles is an acute angle between a tangent of the first curved display region and a plane where the planar display region is located; and an offset d corresponding to a first light-emitting element with a bending angle α satisfies the following:

$$0 < d \le t \cdot \tan\theta - t \cdot \tan\theta_0; \text{ where}$$

$$\theta = \arcsin\frac{n_0 \cdot \sin(\beta + \alpha)}{n}; \text{ and}$$

$$\theta_0 = \arcsin\frac{n_0 \cdot \sin\beta}{n}.$$

t denotes a thickness of the dielectric layer, θ denotes a critical incident angle in a case where an exiting direction of assumed critical exiting light of the first light-emitting element is parallel to an exiting direction of critical exiting light which is incident from an edge of the light-emitting element in the first display region to the dielectric layer and exited through an edge of a corresponding opening when the bending angle is α, $\theta_0$ denotes a critical incident angle of light which is incident from the edge of the light-emitting element in the first display region to the dielectric layer and exited through an edge of a corresponding opening, β denotes a critical exiting angle of light which is exited from the edge of the light-emitting element in the first display region to the edge of the corresponding opening and exited from the display panel, n denotes a refractive index of the dielectric layer, and no denotes a refractive index of a medium located outside a light exiting surface of the display panel.

The dielectric layer is a transparent film between the display function layer and the light-shielding layer. Optionally, the dielectric layer includes a thin film encapsulation layer. For example, the thin film encapsulation layer may include at least one inorganic layer, an organic layer and an inorganic layer which are stacked. In a specific implementation, the thin film encapsulation layer may include an inorganic layer with a thickness of 1 μm, an organic layer with a thickness of 6-10 μm and an inorganic layer with a thickness of 1.3 μm. In other embodiments, the thin film encapsulation layer may include a greater number of inorganic layers and organic layers. The bending angle α refers to a bending angle at a position where the center of the corresponding first light-emitting element is located. When the exiting direction of the assumed critical exiting light of the first light-emitting element is parallel to an exiting direction of critical exiting light which is incident from an edge of the light-emitting element in the first display region on the dielectric layer and exited through an edge of a corresponding opening, the first display region and the second display region have the same viewing angle so that the first display region and the second display region have uniform display effect. The medium except the light emission surface of the display panel may be air.

Figure 13:
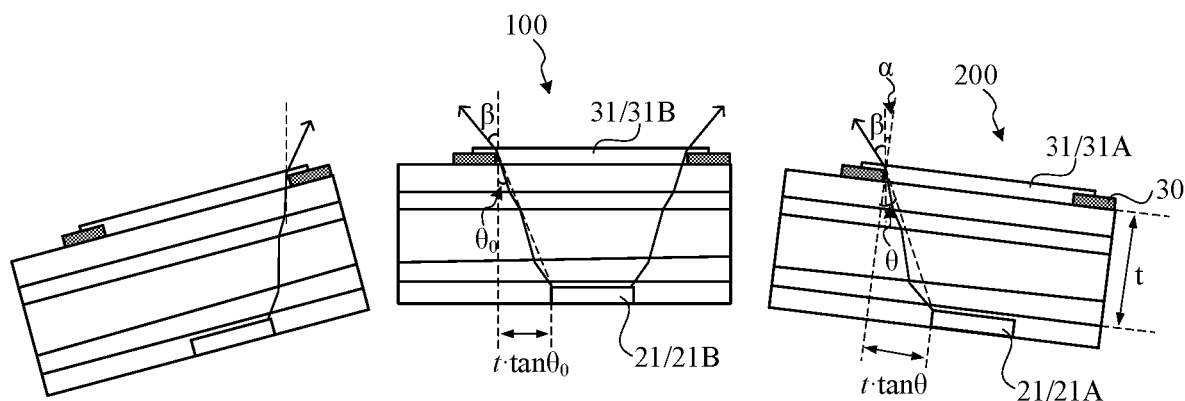
FIG. 13 is a schematic diagram of an optical path of a display panel according to an embodiment of the present disclosure.

For example, the double-curved display panel is used as an example. FIG. 13 is a schematic diagram of an optical path of a display panel according to an embodiment of the present disclosure. Referring to FIG. 13, in a first display region 100, a distance between an edge of each light-emitting element 21 and an edge of a corresponding light-shielding layer 30 is t·tan $\theta_0$, and $$\theta_0 = \arcsin\frac{n_0 \cdot \sin\beta}{n}$$

is, and is obtained according to a refraction law n·sin $\theta_0 = n_0 \cdot \sin\beta$. In a second display region 200, a distance between an edge of each light-emitting element 21 and an edge of a corresponding light-shielding layer 30 is t·tan θ, and $$\theta = \arcsin\frac{n_0 \cdot \sin(\beta + \alpha)}{n}$$

is obtained according to a refraction law n·sin $\theta = n_0 \cdot \sin(\beta + \alpha)$. In the present embodiment, an offset d is set between 0 and t·tan θ−t·tan $\theta_0$. In a design, the offset includes a process error in a process of aligning a light-emitting element and an opening.

Optionally, the dielectric layer includes m sub-dielectric layers with different refractive indexes, where the m sub-dielectric layers are laminated, n denotes an equivalent refractive index of all the m sub-dielectric layers, t denotes a sum of thicknesses of all the m sub-dielectric layers, and θ denotes an equivalent incident angle of all the m sub-dielectric layers.

n and θ are derived from the following formulas:

$$n_i \cdot \sin\theta_i = n_0 \cdot \sin\beta = n \cdot \sin\theta; \text{ and}$$

$$\sum_1^m t_i \cdot \tan\theta_i = \left(\sum_1^m t_i\right) \cdot \tan\theta.$$

m is an integer greater than or equal to 2, 1≤i≤m, and i is an integer.

Figure 14:
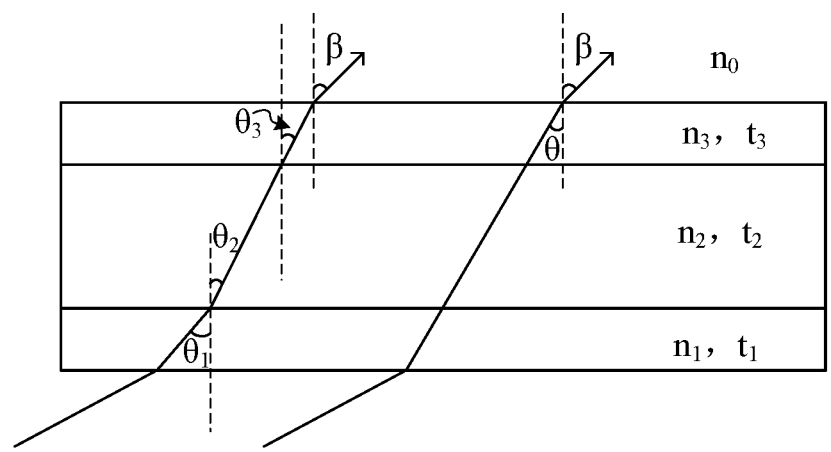
FIG. 14 is a structure diagram of a dielectric layer according to an embodiment of the present disclosure.

For example, m=3. FIG. 14 is a structure diagram of a dielectric layer according to an embodiment of the present disclosure. Referring to FIG. 14, according to the refraction law, the light is refracted once every time passing through one sub-dielectric layer. Therefore, $n_1 \cdot \sin \theta_1 = n_2 \cdot \sin \theta_2 = n_3 \cdot \sin \theta_3 = n_0 \cdot \sin \beta$, and $t_1 \cdot \tan \theta_1 + t_2 \cdot \tan \theta_2 + t_3 \cdot \tan \theta_3 = t \cdot \tan \theta$. To make light emitted from the curved display region and the planar display region have the same viewing angle, $n_0 \cdot \sin \beta = n \cdot \sin \theta$ needs to be satisfied. From the formulas, the equivalent refractive index and the equivalent incident angle of the dielectric layer can be obtained.

Optionally, the display panel further includes a touch function layer, where the touch function layer is located between the thin film encapsulation layer and the light-shielding layer, and the dielectric layer further includes an inorganic layer in the touch function layer.

Figure 15:
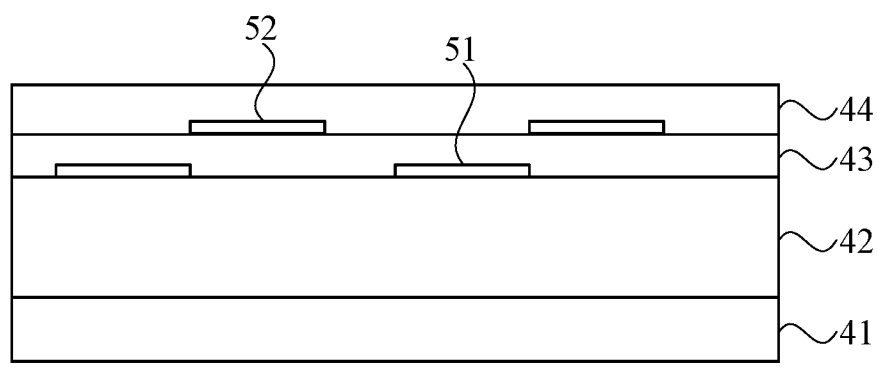
FIG. 15 is a structure diagram of another dielectric layer according to an embodiment of the present disclosure.

The touch function layer is used for achieving a touch function of the display panel. In a specific implementation, the touch function layer may be formed of a metal material or a metal oxide and may include a single-layer structure or a double-layer structure. For example, FIG. 15 is a structure diagram of another dielectric layer according to an embodiment of the present disclosure. Referring to FIG. 15, the dielectric layer includes a first inorganic layer 41, a first organic layer 42, a first touch function layer 51, a second inorganic layer 43, a second touch function layer 52 and a third inorganic layer 44. Each of the first touch function layer 51 and the second touch function layer 52 has a relatively small thickness and generally does not have a thickness. In an actual process, the second inorganic layer 43 and the third inorganic layer 44 are integrated as an inorganic layer, which is used as an inorganic layer in a thin film encapsulation layer.

The technical solution of the embodiments of the present disclosure may be applicable to a foldable display panel in addition to the display panel including the curved display region on the edge. Optionally, the first display region is a planar display region, and the second display region is a foldable display region.

Optionally, the number of first display regions is at least two, and the second display region is located between two adjacent first display regions. Along directions pointing to a centerline of the second display region from two sides of the second display region, an offset progressively increases, where the two sides are sides adjacent to the two adjacent first display regions, respectively.

Figure 16:
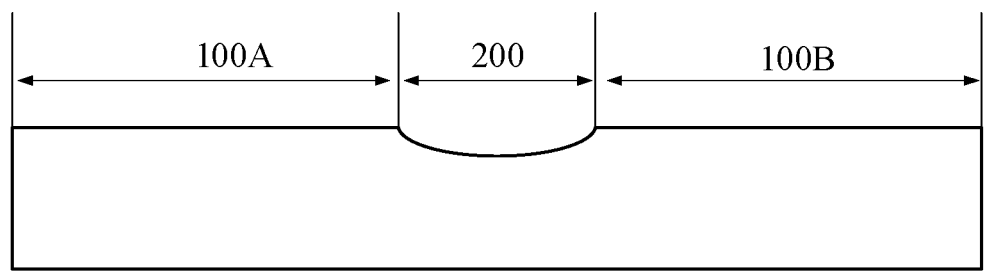
FIG. 16 is a structure diagram of another display panel according to an embodiment of the present disclosure.

For example, FIG. 16 is a structure diagram of another display panel according to an embodiment of the present disclosure. Referring to FIG. 16, the display panel includes two first display regions 100A and 100B and a second display region 200 located between the two first display regions 100A and 100B. The two first display regions 100A and 100B are planar display regions, and the second display region 200 is a flexible display region. When the second display region 200 is bent, the two first display regions 100A and 100B may be folded together.

Figure 17:
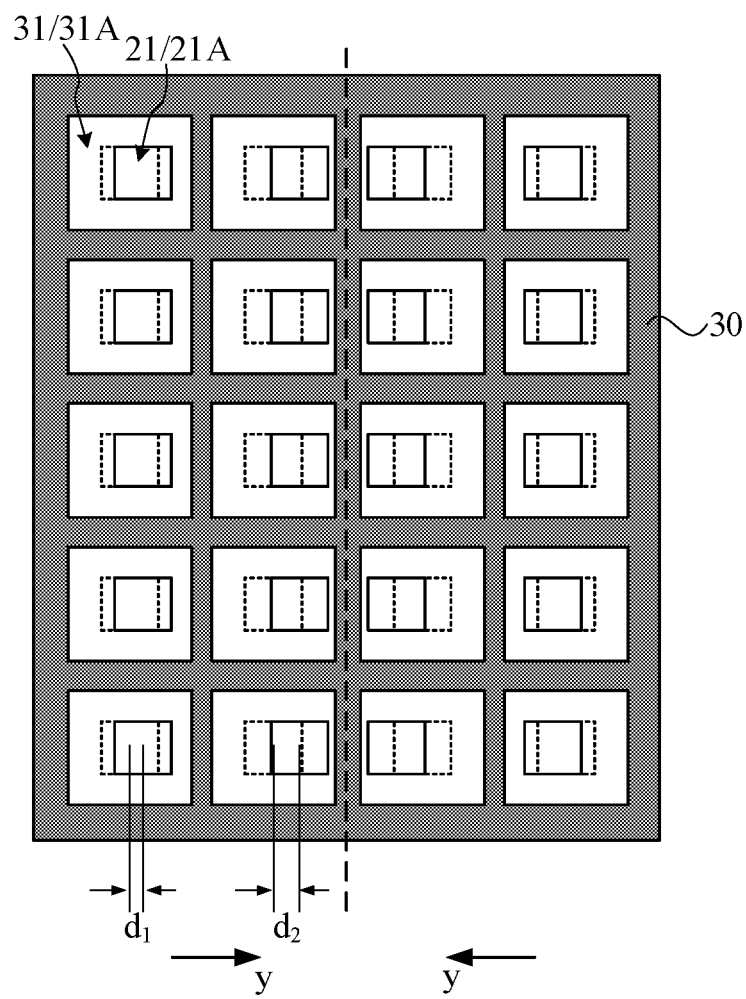
FIG. 17 is a partial top view of a second display region in FIG. 16.

Since the second display region 200 is the flexible display region, a certain deformation will inevitably occur during display, for example, the second display region 200 has a groove shown in FIG. 16. A bending angle thereof will vary along directions pointing to a centerline from two sides of the second display region. FIG. 17 is a partial top view of a second display region in FIG. 16. Referring to FIG. 17, along directions y pointing to the centerline (a dashed line in FIG. 17) from two sides of the second display region, the offset corresponding to the light-emitting element gradually increases, that is, $d_2 > d_1$ in FIG. 17. The offset corresponding to the light-emitting element in the second display region is designed according to a rule that the offset is symmetrical about the centerline of the second display region, that is, along the directions pointing to the centerline of the second display region from the two sides of the second display region, the offset progressively increases, thereby improving the display uniformity of the planar display region and the foldable display region.

It is to be noted that FIG. 17 shows only two columns of light-emitting elements located on both sides of the centerline of the second display region, the number and position relationship are only for illustratively showing that the center of the light-emitting element has the offset relative to the center of the opening and are not to limit the embodiments of the present disclosure. A representation of the drawings is similar to the preceding embodiments, and a specific arrangement of the light-emitting elements and the corresponding openings may be determined according to an actual arrangement of pixels in the display panel.

In the embodiments of the present disclosure, the first light-emitting element has a certain offset with a corresponding first opening so that the uniformity of the first display region and the second display region is improved, where the second display region may be the curved display region. In a specific implementation, each first light-emitting element in the second display region may correspond to the same offset according to an actual need, for example, in the case where the curved display region has a relatively small variation in bending angle; at least two first light-emitting elements may correspond to different offsets, for example, the second display region is divided into a plurality of sub-regions, where first light-emitting elements in each of the plurality of sub-regions correspond to the same offset, and all the plurality of sub-regions correspond to different offsets, for example, a display area of the curved display region is relatively large, and the bending angle varies slowly so that a design difficulty can be reduced; and the offset corresponding to the first light-emitting element may progressively increase along the first direction so that the display effect of the second display region and the display effect of the first display region tend to be consistent to a maximum extent.

In an embodiment of the present disclosure, to achieve that the first light-emitting element has the offset along the first direction relative to the corresponding first opening, a position of the first opening may be adjusted without a variation in a position of the first light-emitting element. Optionally, in the second display region, the first light-emitting element is arranged in an array, and the first opening has an offset along a direction opposite to the first direction relative to the first light-emitting element exposed by the first opening.

It is to be understood that in the present embodiment, that the first light-emitting element is arranged in an array may be understood as that a distance between centers of two adjacent first light-emitting elements is the same along a row direction of the array and a distance between centers of two adjacent first light-emitting elements is the same along a column direction of the array. The distance between the centers of two adjacent first light-emitting elements in the row direction and the distance between the centers of two adjacent first light-emitting elements in the column direction may be the same or different. For the light-emitting elements of a plurality of different emitted colors (such as the red light-emitting element, the blue light-emitting element and the green light-emitting element), the same light-emitting elements are arranged in an array. For the same pixel unit (for example, one red light-emitting element, one blue light-emitting element and one green light-emitting element are included), a specific arrangement of sub-pixels is not limited, which may be designed according to an actual situation in a specific implementation.

Figure 18:
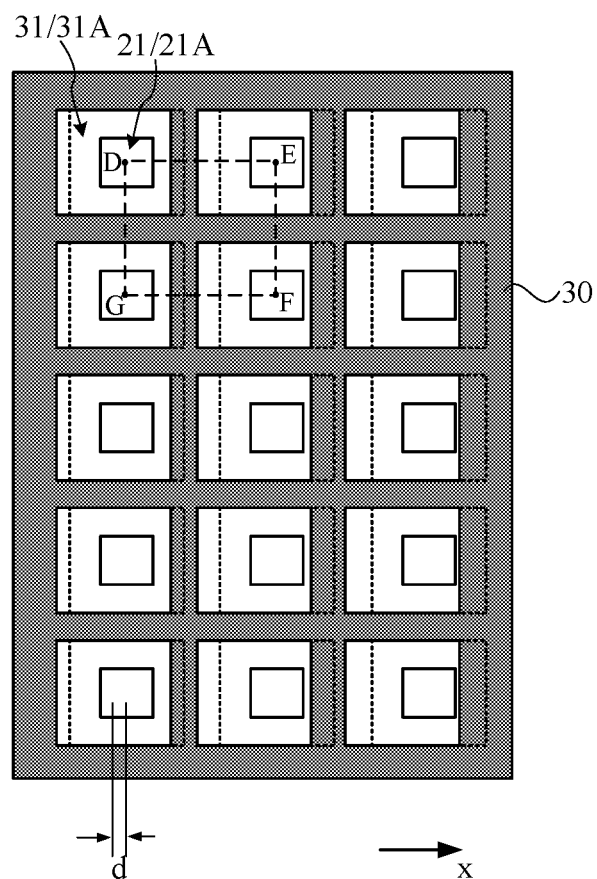
FIG. 18 is a partial top view of another display panel according to an embodiment of the present disclosure.

For example, a display panel showing a light-emitting element is used as an example. FIG. 18 is a partial top view of another display panel according to an embodiment of the present disclosure. Referring to FIG. 18, in a second display region, first light-emitting elements 21A are arranged in an array with an equal distance (a line connecting centers of four first light-emitting elements in two adjacent rows and two adjacent columns is square, for example, a line connecting D, E, F and G in FIG. 18 is square, where D, E, F and G denote centers of corresponding first light-emitting elements, respectively). A position of a first opening 31A is varied so that a first light-emitting element has an offset with a corresponding first opening, where a dashed-line box corresponding to the first opening 31A indicates a position where no offsets occur in the first opening 31A, and a solid-line box indicates a position after the offset occurs. It is to be understood that when the offset occurs in the first opening, a width of a corresponding light-shielding layer becomes narrow and a specific width of the light-shielding layer is determined by the offset.

In another embodiment, the position of the first light-emitting element may be adjusted without a variation in the position of the first opening. Optionally, in the second display region, the first opening is arranged in an array, and the first light-emitting element has an offset along the first direction relative to the first opening exposing the first light-emitting element.

It is to be understood that the first opening in the present embodiment is arranged in an array similar to the preceding embodiments and the first opening is an opening corresponding to the first light-emitting element. A distance between centers of two adjacent first openings is the same along a row direction of the array, and a distance between centers of two adjacent first openings is the same along a column direction of the array. The distance between the centers of two adjacent first openings in the row direction and the distance between the centers of two adjacent first openings in the column direction may be the same or different. For the light-emitting elements of a plurality of different emitted colors, a plurality of types of corresponding first opening may be disposed, and each of the plurality of types of corresponding first opening is arranged in an array.

One of the plurality of types of corresponding first opening is used as an example. With continued reference to FIG. 11, optionally, in the second display region, distances between adjacent first openings 31A are the same along the first direction. That is, line segments HI and IJ are equal in length, where H, I and J are centers of corresponding first openings, respectively. The position of the first light-emitting element 21A is varied so that the first light-emitting element has the offset with the corresponding first opening.

Optionally, in a specific implementation, along the first direction, a distance between adjacent first openings in the second display region is equal to a distance between adjacent openings in the first display region. An area proportion of openings in the first display region is the same as an area proportion of openings in the second display region.

The distance between the openings in the first display region is the same as the distance between the openings in the second display region, and the area proportion of openings in the first display region is the same as the area proportion of openings in the second display region, that is, the first display region and the second display region have the same aperture ratio and the same disposition manner of openings, which can ensure that the first display region and the second display region have the same reflectance and the same hue, improving the display consistency of the first display region and the second display region.

Optionally, with continued reference to FIG. 8 or FIG. 9, an area of the opening is greater than an area of a light-emitting element exposed by the opening.

It is to be understood that the light emitted by the light-emitting element has certain exit angles, and since the opening is disposed on the light-emitting element, the area the opening is greater than the area of the corresponding light-emitting element so that a loss of the light exited by the light-emitting element can be reduced as much as possible. Further, each first opening has the same area. Each first opening has the same area so that a manufacturing process can be simplified and a cost can be reduced. In addition, in the present embodiment, each opening has the same area, and each light-shielding layer has the same area, preventing reflectance and hue at each position of the display panel from a variation. The reflectance inconsistency and the hue inconsistency will not be additionally brought about when the problem of the display non-uniformity caused by different viewing angles is solved.

Optionally, the opening and light-emitting element have the same shape.

The shapes openings and the shapes of the light-emitting elements are not specifically limited in the embodiments of the present disclosure and may be selected according to an actual situation, for example, may be square, rectangular, rhombic, circular, rounded rectangular or octagonal in shape.

In other embodiments, the plurality of openings and the plurality of light-emitting elements may have different shapes. For example, the plurality of openings are rounded rectangular in shape, and the light-emitting elements are rectangular in shape, or for example, the openings are circular in shape, and the light-emitting elements are rectangular in shape, which is not limited in the embodiments of the present disclosure.

Figure 19:
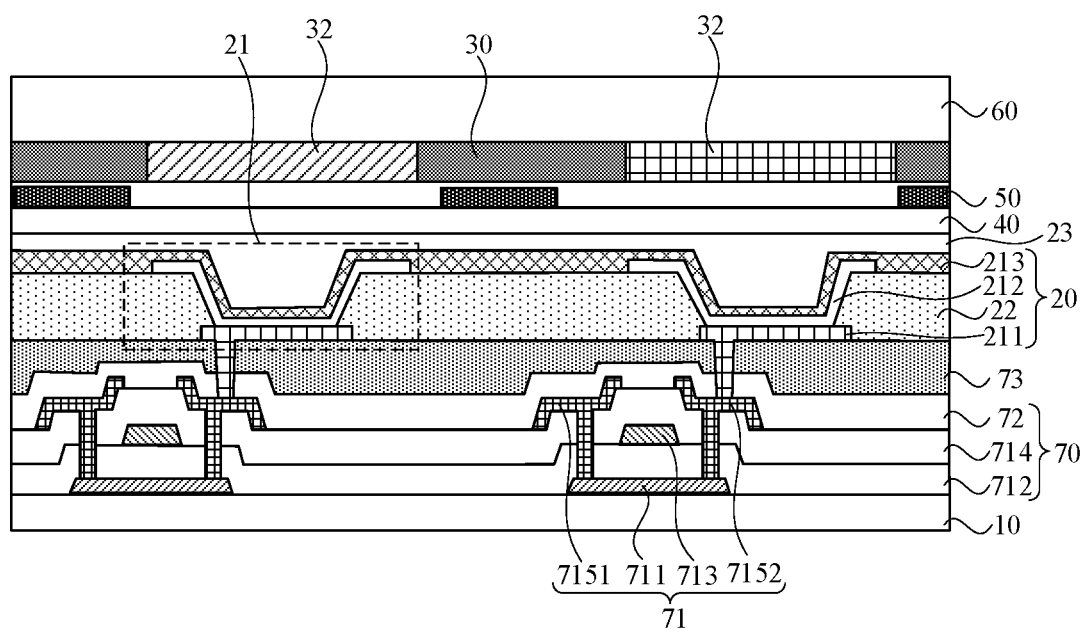
FIG. 19 is a structure diagram of a display panel according to an embodiment of the present disclosure.

For a specific film structure of the display panel, FIG. 19 is a structure diagram of a display panel according to an embodiment of the present disclosure. A structure shown in FIG. 19 is a structure of the first display region, and an overall structure of the second display region is the same as that of the first display region, except that a position of the light-emitting element in the second display region has the offset relative to a position of the corresponding opening. Referring to FIG. 19, the display panel includes a substrate 10, where the substrate 10 may be flexible and thus stretchable, foldable, bendable or rollable, such that the display panel may be stretchable, foldable, bendable or rollable. The substrate 10 may be formed of any suitable insulating material having flexibility. The substrate 10 may be used for blocking oxygen and moisture, preventing the moisture or impurities from diffusing through the substrate 10. A planar surface may be formed on an upper surface of the substrate 10. For example, the substrate 10 may be formed of a polymer material such as PI, polycarbonate (PC), polyethersulfone (PES), polyethylene terephthalate (PET), polyethylene naphthalate (PEN), a polyarylate (PAR) or a glass-fibre-reinforced plastic (FRP) and may be transparent, translucent or opaque. Optionally, the display panel may further include a buffer layer (not shown in FIG. 17) located on the substrate 10, and the buffer layer may cover an entire upper surface of the substrate 10. The substrate 10 may also be rigid, for example, may be a glass substrate so that a rigid display panel is formed.

An array layer 70 is located on a side of the substrate 10. Specifically, the array layer 70 is located on a side of the substrate 10 facing towards a display surface of the display panel. The array layer 70 may include a plurality of TFTs 71 and a pixel circuit consisting of the plurality of TFTs 71 for driving a light-emitting element in a display function layer. For example, in the present embodiment, a top-gate TFT is used as an example for describing a structure. Each of the plurality of TFT layers 71 includes an active layer 711 located on the substrate 10, and the active layer 711 may be made of an amorphous silicon material, a polycrystalline silicon material, a metal oxide material or the like. When the active layer 711 uses the polycrystalline silicon material, the active layer 711 may be formed through low-temperature amorphous silicon technology, that is, the amorphous silicon material is melted by a laser so that the polycrystalline silicon material is formed. Additionally, various methods such as rapid thermal annealing (RTA), solid-phase crystallization (SPC), excimer laser annealing (ELA), metal-induced crystallization (MIC), metal-induced lateral crystallization (MILC) or succession lateral solidification (SLS) may also be used. The active layer 711 further includes a source region and a drain region formed by doping an N-type impurity ion or a P-type impurity ion, and a channel region is formed between the source region and the drain region. The array layer 70 further includes a gate insulating layer 712 located on the active layer 711, and the gate insulating layer 712 includes an inorganic layer such as silicon oxide or silicon nitride and may include a single layer or a plurality of layers. The thin film encapsulation layer 71 further includes a gate 713 located on the gate insulating layer 712, and the gate 713 may include a single layer or a plurality of layers made of gold (Au), silver (Ag), copper (Cu), nickel (Ni), platinum (Pt), palladium (Pd), aluminium (Al), molybdenum (Mo) or chromium (Cr), or an alloy such as an alloy of aluminium (Al) and neodymium (Nd) or an alloy of molybdenum (Mo) and tungsten (W), which may be selected according to an actual situation in a specific implementation. The array layer 70 further includes an interlayer insulating layer 714 located on the gate 713, and the interlayer insulating layer 714 may include an inorganic material or an organic material. The inorganic material may include at least one selected from silicon nitride, aluminium nitride, zirconium nitride, titanium nitride, hafnium nitride, tantalum nitride, silicon oxide, aluminium oxide, titanium oxide, tin oxide, cerium oxide and silicon oxynitride. The organic material may include at least one selected from an acrylic resin, a methacrylic resin, polyisoprene, a vinyl resin, an epoxy resin, a urethane resin, a cellulosic resin and a perylene resin. The TFT layer 71 further includes a source electrode 7151 and a drain electrode 7152 which are located on the interlayer insulating layer 714. The source electrode 7151 and the drain electrode 7152 are electrically connected to the source region and the drain region through contact holes, respectively, and each of the contact holes may be formed through a selective removal of the gate insulating layer 712 and the interlayer insulating layer 714.

The array layer 70 may also include a passivation layer 72. Optionally, the passivation layer 72 is located on the source electrode 7151 and the drain electrode 7152 of the TFT 71. The passivation layer 72 may be formed of an inorganic material such as silicon oxide or silicon nitride, or may be formed of an organic material. The display panel may further include a planarization layer 73. Optionally, the planarization layer 73 is located on the passivation layer 72. The planarization layer 73 may include an organic material such as acrylic, PI or benzocyclobutene (BCB) and has a planarization function.

A display function layer 20 located on a side of the array layer 70 facing away from the substrate 10 includes a plurality of light-emitting elements 21. Optionally, the display function layer 20 is located on the planarization layer 73. The display function layer 20 includes an anode layer 211, an intermediate layer 212 and a cathode layer 213 that are sequentially disposed along a direction facing away from the substrate 10. The anode layer 211 may be formed of various conductive materials. For example, the anode layer 211 may be formed as a transparent electrode or a reflective electrode according to a use thereof. When an anode is formed into the transparent electrode, the transparent electrode may include, for example, indium tin oxide (ITO), indium zinc oxide (IZO), zinc oxide (ZnO) or indium(III) oxide ($In_2O_3$). When the anode is formed into the reflective electrode, a reflective layer may be made of silver (Ag), magnesium (Mg), aluminium (Al), platinum (Pt), palladium (Pd), gold (Au), nickel (Ni), neodymium (Nd), iridium (Ir), chromium (Cr) or a mixture thereof. ITO, IZO, ZnO, $In_2O_3$ or the like may be formed on the reflective layer. The intermediate layer 212 may include a low molecular material or a polymer material. When the intermediate layer 212 includes the low molecular material, the intermediate layer 212 may include an emissive layer (EML) and may further include at least one of an HIL, an HTL, an ETL and an EIL. The intermediate layer 212 may include various organic materials such as copper phthalocyanine (CuPc), N,N'-bis (naphthalene-1-yl)-N,N-bis(phenyl)-benzidine (NPB) or tris (8-hydroxyquinolinato)aluminium (Alq3). The intermediate layer 212 may be formed through vapor deposition.

When the intermediate layer 212 includes the polymer material, the intermediate layer 212 may include the HTL and the EML. The HTL may include poly(3,4-ethylenedioxythiophene) (PEDOT), and the EML may include a poly (p-phenylene vinylene) (PPV) material and a polyfluorene polymer material. The intermediate layer 212 may be formed through screen printing, inkjet printing, laser induced thermal imaging (LITI) or the like.

However, the intermediate layer 212 is not limited to the above examples. The intermediate layer 212 may include a single layer across a plurality of anode layers 211 or a plurality of patterned layers relative to each of the plurality of anode layers 211. The display function layer 20 further includes a pixel defining layer 22 located on a side of the anode layer 211 facing away from the array layer 70. A size of the light-emitting element 21 is determined by a size of the opening on the pixel defining layer 22. In the present embodiment, the center of the light-emitting element 21 is the center of the opening on the pixel defining layer 22 (what is shown in FIG. 19 is a sectional view, where a center thereof is a midpoint of a bottom of the opening formed on the pixel defining layer 22, an actual opening is a two-dimensional shape on the display panel, and the center of the opening is a geometric center of the opening). The pixel defining layer 22 may be formed of an organic material such as PI, polyamide, BCB, an acrylic resin or a phenolic resin, or an inorganic material such as SiNx. When the cathode layer 213 is formed as the transparent electrode, a compound with a small work function and having such as lithium (Li), calcium (Ca), lithium fluoride/calcium (LiF/Ca), lithium fluoride/aluminium (LiF/Al), aluminium (Al), magnesium (Mg) or a combination thereof may be initially deposited on the light-emitting layer through evaporation, and a material for forming the transparent electrode such as ITO, IZO, ZnO or $In_2O_3$ may be deposited on the compound. When a cathode is formed into the reflective electrode, Li, Ca, LiF/Ca, LiF/Al, Al, Mg or a mixture thereof is evaporated on an entire surface of the substrate so that the cathode is formed.

Optionally, the anode layer 211 includes a plurality of anode patterns in a one-to-one correspondence with pixels, and the plurality of anode patterns in the anode layer 211 are connected to the source electrode 7151 or drain electrode 7152 of the TFT 71 through a via on the planarization layer 73. The pixel defining layer 22 includes a plurality of openings exposing the anode layer 211 and may cover an edge of each of the plurality of patterns in the anode layer 211. The intermediate layer 212 is at least partially filled within the plurality of openings of the pixel defining layer 22 and is in contact with the anode layer 211.

Optionally, the anode layer 211, the intermediate layer 212 and the cathode layer 213 defined by an opening of each pixel defining layer 22 constitute the light-emitting element 21 (as shown in a dashed-line box in FIG. 19), each light-emitting element 21 can emit light of different colors according to different intermediate layers 212 and constitute one sub-pixel, and a plurality of sub-pixels jointly perform the image display.

Optionally, the display panel further includes an encapsulation layer 40 located on the display function layer 20. The encapsulation layer 40 completely covers the display function layer 20 to seal the display function layer 20. To planarize the display function layer 20, a planarization layer 23 is further disposed on the display function layer 20. Optionally, the encapsulation layer 40 may be a TFE layer located on the planarization layer 23. The encapsulation layer 40 includes a first inorganic encapsulation layer, an organic encapsulation layer and a second inorganic encapsulation layer (a specific film of the encapsulation layer 40 is not shown in FIG. 19) sequentially disposed along the direction facing away from the substrate 10, for preventing water and oxygen from corroding the plurality of light-emitting elements 21. Of course, in other optional embodiments of the present disclosure, the encapsulation layer 40 may include an organic material and an inorganic material which are stacked in any number as needed, but at least one layer of organic material and at least one layer of inorganic material are alternately deposited, and a lowermost layer and an uppermost layer are made of the inorganic material.

Figure 20:
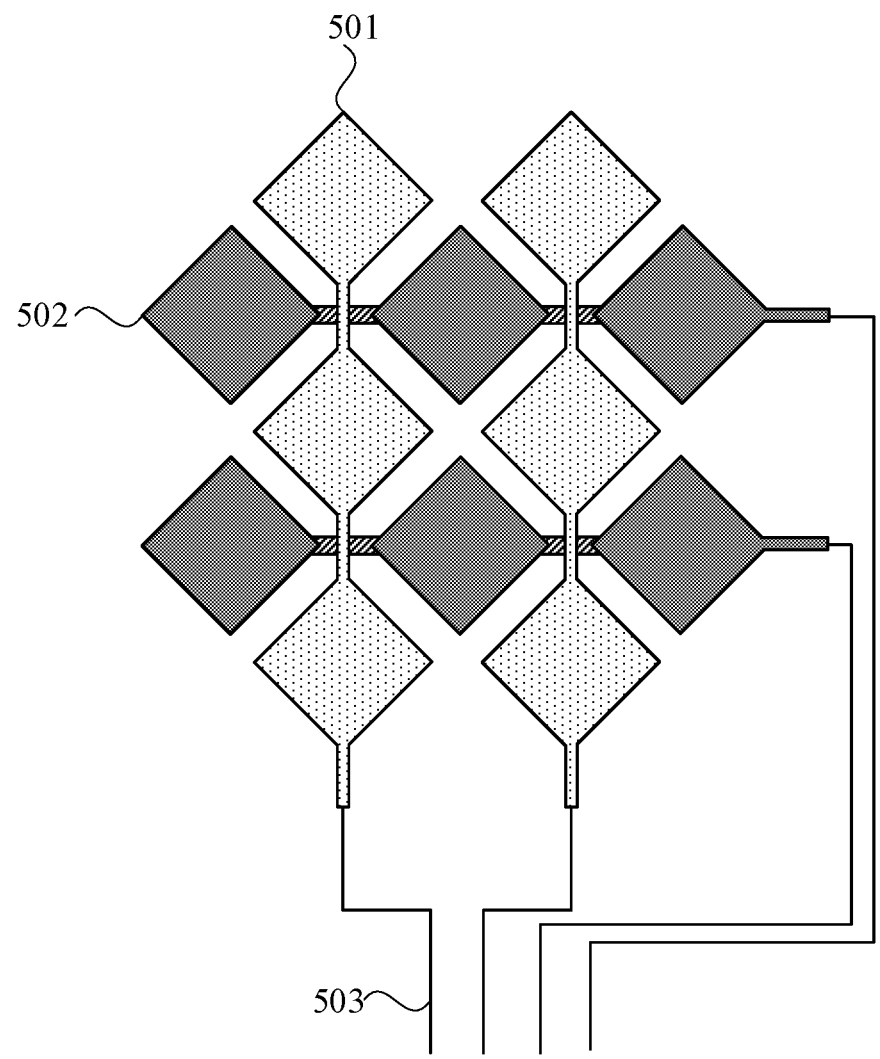
FIG. 20 is a top view of a touch function layer according to an embodiment of the present disclosure.

The display panel further includes a touch function layer 50. The touch function layer 50 includes a plurality of touch electrodes for achieving a touch function, and in a specific implementation, a self-capacitance manner or a mutual-capacitance manner may be used. A single-layer touch electrode, a double-layer touch electrode or a metal mesh-shaped touch electrode may be disposed on the touch function layer 50. The metal mesh-shaped touch electrode includes a plurality of metal lines extending along two mutually intersecting directions, and metal meshes extending along different directions are crossed to form a mesh, which may be selected according to an actual situation in a specific implementation. For example, FIG. 20 is a top view of a touch function layer according to an embodiment of the present disclosure. A mutual-capacitance manner is used as an example. The touch function layer includes a plurality of touch driving electrodes 501 and a plurality of touch sensing electrodes 502, and each of the plurality of touch driving electrodes 501 and each of the plurality of touch sensing electrodes 502 are directly and electrically connected to one touch wire 503, respectively. When the touch function layer includes a plurality of layers, the insulating layer between the touch function layers may be served as the inorganic layer in the TFE layer.

The display panel further includes the light-shielding layer 30 and a color resist layer 32 which are located on the TFE layer 40. The color resist layer 32 includes a plurality of color resists disposed at the plurality of openings, and a color of each of the plurality of color resists is the same as a color of a corresponding light-emitting element. The plurality of color resists is used for transmitting the light emitted by the plurality of light-emitting elements. A design scheme that the polarizer is replaced with the color resist is conducive to achieving flexible display of the display panel.

The display panel further includes a protective layer 60 located on the light-shielding layer 30. Optionally, the protective layer 60 is an outermost film of the display panel. The protective layer 60 may be a protective cover plate or a protective film. The protective layer 60 may be bonded to an adjacent film inside the display panel through an optically clear adhesive (OCA). For a touch display panel, a surface of the protective layer 60 is a surface of the display panel for a touch operation.

Figure 21:
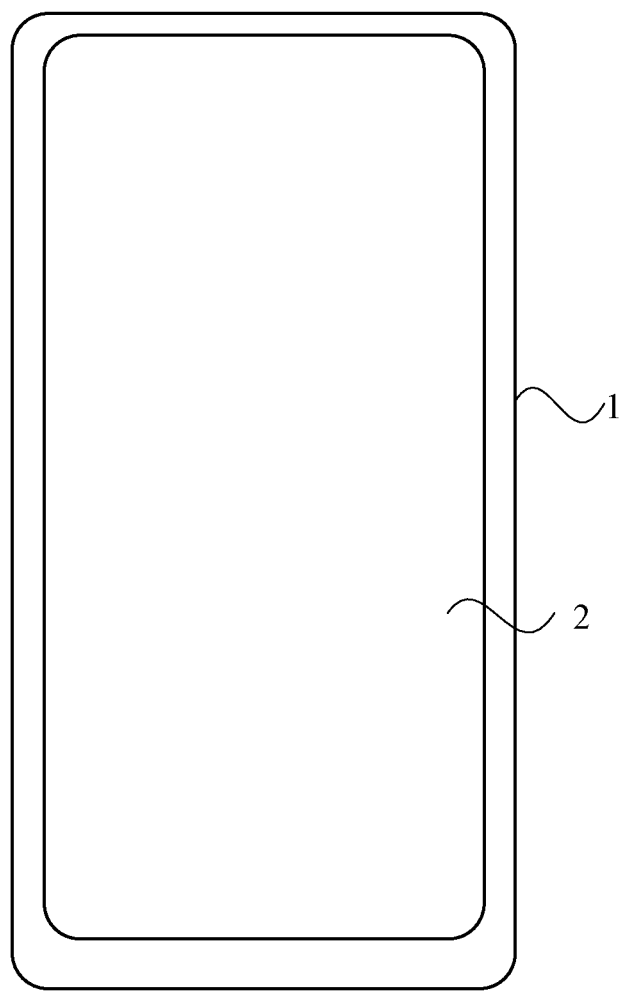
FIG. 21 is a structure diagram of a display device according to an embodiment of the present disclosure.

FIG. 21 is a structure diagram of a display device according to an embodiment of the present disclosure. Referring to FIG. 21, a display device 1 includes any display panel 2 according to the embodiments of the present disclosure. The display device 1 may be a device containing a display function, such as a mobile phone, a computer and an intelligent wearable device.

It is to be noted that the preceding are only preferred embodiments of the present disclosure and technical principles used therein. It is to be understood by those skilled in the art that the present disclosure is not limited to the embodiments described herein. For those skilled in the art, various apparent modifications, adaptations, combinations, and substitutions can be made without departing from the scope of the present disclosure. Therefore, while the present disclosure has been described in detail via the preceding embodiments, the present disclosure is not limited to the preceding embodiments and may include more equivalent embodiments without departing from the inventive concept of the present disclosure. The scope of the present disclosure is determined by the scope of the appended claims.

What is claimed is:
1. A display panel, comprising:
a substrate;
a display function layer located on the substrate, wherein the display function layer comprises a plurality of light-emitting elements; and
a light-shielding layer located on a side of the display function layer facing away from the substrate, wherein a plurality of openings are disposed on the light-shielding layer, and the plurality of openings expose the plurality of light-emitting elements;
wherein the plurality of light-emitting elements comprise a first light-emitting element, an opening exposing the first light-emitting element is a first opening, a center of the first light-emitting element has an offset along a first direction relative to a center of the first opening, and the first direction is parallel to a plane where the substrate is located;
the display panel further comprises a first display region and a second display region;
wherein the first display region is a planar display region, and the second display region is a first curved display region; and
wherein the first direction is a direction pointing to the second display region from the first display region;
wherein the display panel further comprises a dielectric layer located between the display function layer and the light-shielding layer;
wherein the first curved display region has a plurality of bending angles, wherein each of the plurality of bending angles is an acute angle between a tangent of the first curved display region and a plane where the planar display region is located;
wherein an offset d corresponding to a first light-emitting element with a bending angle α satisfies that: $0 < d \leq t \cdot \tan \theta - t \cdot \tan \theta_0$;
wherein

$$\theta = \arcsin \frac{n_0 \cdot \sin(\beta + \alpha)}{n}; \text{ and}$$

$$\theta_0 = \arcsin \frac{n_0 \cdot \sin \beta}{n};$$

wherein t denotes a thickness of the dielectric layer, θ denotes a critical incident angle in a case where an exiting direction of assumed critical exiting light of the first light-emitting element is parallel to an exiting direction of critical exiting light which is incident from an edge of the light-emitting element in the first display region to the dielectric layer and exited through an edge of a corresponding opening when the bending angle is α, $\theta_0$ denotes a critical incident angle of light which is incident from the edge of the light-emitting element in the first display region to the dielectric layer and exited through an edge of a corresponding opening, β denotes a critical exiting angle of light which is exited from the edge of the light-emitting element in the first display region to the edge of the corresponding opening and exited from the display panel, n denotes a refractive index of the dielectric layer, and no denotes a refractive index of a medium located outside a light exiting surface of the display panel; and wherein the dielectric layer comprises m sub-dielectric layers with different refractive indexes, wherein the m sub-dielectric layers are laminated, n denotes an equivalent refractive index of all the m sub-dielectric layers, t denotes a sum of thicknesses of all the m sub-dielectric layers, and θ denotes an equivalent incident angle of all the m sub-dielectric layers; and n and θ are derived from the following formulas:

$$n_i \cdot \sin\theta_i = n_0 \cdot \sin\beta = n \cdot \sin\theta; \text{ and}$$

$$\sum_1^m t_i \cdot \tan\theta_i = \left(\sum_1^m t_i\right) \cdot \tan\theta;$$

wherein m is an integer greater than or equal to 2, 1≤i≤m, and i is an integer.

2. The display panel according to claim 1, wherein the first light-emitting element is located in the second display region.

3. The display panel according to claim 2, wherein the plurality of light-emitting elements further comprise a second light-emitting element, wherein an opening exposing the second light-emitting element is a second opening, and a center of the second light-emitting element coincides with a center of the second opening; and the second light-emitting element is located in the first display region.

4. The display panel according to claim 2, wherein the first display region is a planar display region, and the second display region is a foldable display region; and wherein the display panel further comprising:

at least two first display regions, and the second display region is located between two adjacent first display regions of the at least two first display regions; and along directions pointing to a centerline of the second display region from each of two sides of the second display region, the offset progressively increases, wherein the two sides are sides adjacent to the two adjacent first display regions, respectively.

5. The display panel according to claim 2, wherein the first display region and the second display region are connected and jointly constitute a second curved display region.

6. The display panel according to claim 2, wherein along the first direction, offsets corresponding to first light-emitting elements progressively increases.

7. The display panel according to claim 6, wherein in the second display region, distances between adjacent first openings are the same along the first direction.

8. The display panel according to claim 6, wherein along the first direction, a distance between adjacent first openings in the second display region is equal to a distance between adjacent openings in the first display region.

9. The display panel according to claim 2, wherein an area proportion of openings in the first display region is the same as an area proportion of openings in the second display region.

10. The display panel according to claim 2, wherein in the second display region, the first light-emitting element is arranged in an array, and the first opening has an offset along a direction opposite to the first direction relative to the first light-emitting element exposed by the first opening.

11. The display panel according to claim 2, wherein in the second display region, the first opening is arranged in an array, and the first light-emitting element has an offset along the first direction relative to the first opening exposing the first light-emitting element.

12. The display panel according to claim 1, wherein the first curved display region has a plurality of bending angles, and each of the plurality of bending angles is an acute angle between a tangent of the first curved display region and a plane where the planar display region is located; and at a same bending angle, each first light-emitting element corresponds to a same offset.

13. The display panel according to claim 1, wherein the first curved display region has a plurality of bending angles, wherein each of the plurality of bending angles is an acute angle between a tangent of the first curved display region and a plane where the planar display region is located;

the first light-emitting element comprises a first type of light-emitting element and a second type of light-emitting element, wherein a first opening exposing the first type of light-emitting element is a first type of opening, a first opening exposing the second type of light-emitting element is a second type of opening, an area of the first type of light-emitting element is greater than an area of the second type of light-emitting element, and an area of the first type of opening is greater than an area of the second type of opening; and at a same bending angle, an offset corresponding to the first type of light-emitting element is less than an offset corresponding to the second type of light-emitting element.

14. The display panel according to claim 1, wherein the first curved display region has a plurality of bending angles, wherein each of the plurality of bending angles is an acute angle between a tangent of the first curved display region and a plane where the planar display region is located; and as the bending angle increases, an offset corresponding to the first light-emitting element progressively increases.

15. The display panel according to claim 1, wherein at least two first light-emitting elements correspond to different offsets.

16. The display panel according to claim 1, wherein an area of an opening of the plurality of openings is greater than an area of a light-emitting element exposed by the opening of the plurality of openings.

17. The display panel according to claim 1, wherein an opening of the plurality of openings has a same shape with a light-emitting element of the plurality of light-emitting elements which is exposed by the opening.

18. The display panel according to claim 1, further comprising a color resist layer, wherein the color resist layer comprises a plurality of color resists disposed at the plurality of openings, and a color of a color resist of the plurality of color resists is the same as a color of a corresponding light-emitting element.

19. The display panel according to claim 1, wherein the light-shielding layer comprises at least one of a touch electrode or a black matrix.

20. The display panel according to claim 1, wherein the display function layer further comprises a pixel defining layer, the pixel defining layer comprises a plurality of openings, and the plurality of light-emitting elements are located at the plurality of openings.

21. The display panel according to claim 1, wherein the dielectric layer comprises a thin film encapsulation layer.

22. The display panel according to claim 21, further comprising a touch function layer;
wherein the touch function layer is located between the thin film encapsulation layer and the light-shielding layer; and
the dielectric layer further comprises an inorganic layer in the touch function layer.

23. A display device, comprising a display panel, wherein the display panel comprises:
a substrate;
a display function layer located on the substrate, wherein the display function layer comprises a plurality of light-emitting elements; and
a light-shielding layer located on a side of the display function layer facing away from the substrate, wherein a plurality of openings are disposed on the light-shielding layer, and the plurality of openings expose the plurality of light-emitting elements;
wherein the plurality of light-emitting elements comprise a first light-emitting element, an opening exposing the first light-emitting element is a first opening, a center of the first light-emitting element has an offset along a first direction relative to a center of the first opening, and the first direction is parallel to a plane where the substrate is located;
the display panel further comprises a first display region and a second display region;
wherein the first display region is a planar display region, and the second display region is a first curved display region; and
wherein the first direction is a direction pointing to the second display region from the first display region;
wherein the display panel further comprises a dielectric layer located between the display function layer and the light-shielding layer;
wherein the first curved display region has a plurality of bending angles, wherein each of the plurality of bending angles is an acute angle between a tangent of the first curved display region and a plane where the planar display region is located;
wherein an offset d corresponding to a first light-emitting element with a bending angle $\alpha$ satisfies that: $0 < d \leq t \cdot \tan \theta - t \cdot \tan \theta_0$;
wherein $\theta = \arcsin n_0 \cdot \sin(\beta + \alpha)/n$; and
$\theta_0 = \arcsin n_0 \cdot \sin \beta/n$;
wherein t denotes a thickness of the dielectric layer, $\theta$ denotes a critical incident angle in a case where an exiting direction of assumed critical exiting light of the first light-emitting element is parallel to an exiting direction of critical exiting light which is incident from an edge of the light-emitting element in the first display region to the dielectric layer and exited through an edge of a corresponding opening when the bending angle is $\alpha$, $\theta_0$ denotes a critical incident angle of light which is incident from the edge of the light-emitting element in the first display region to the dielectric layer and exited through an edge of a corresponding opening, $\beta$ denotes a critical exiting angle of light which is exited from the edge of the light-emitting element in the first display region to the edge of the corresponding opening and exited from the display panel, n denotes a refractive index of the dielectric layer, and no denotes a refractive index of a medium located outside a light exiting surface of the display panel; and
wherein the dielectric layer comprises m sub-dielectric layers with different refractive indexes, wherein the m sub-dielectric layers are laminated, n denotes an equivalent refractive index of all the m sub-dielectric layers, t denotes a sum of thicknesses of all the m sub-dielectric layers, and $\theta$ denotes an equivalent incident angle of all the m sub-dielectric layers; and
n and $\theta$ are derived from the following formulas:

$n_i \sin \theta_i = n_0 \sin \beta = n \cdot \sin \theta$; and $$\sum_1^m t_i \cdot \tan\theta_i = \left(\sum_1^m t_i\right) \cdot \tan\theta;$$

wherein m is an integer greater than or equal to 2, $1 \leq i \leq m$, and i is an integer.

* * * * *